(12) United States Patent
Yoo et al.

(10) Patent No.: US 12,197,689 B2
(45) Date of Patent: Jan. 14, 2025

(54) FOLDABLE DISPLAY DEVICE AND ELECTRONIC DEVICE INCLUDING THE SAME

(71) Applicant: SAMSUNG DISPLAY CO., LTD., Yongin-si (KR)

(72) Inventors: Bugyoon Yoo, Yongin-si (KR); Yunjae Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/325,167

(22) Filed: May 30, 2023

(65) Prior Publication Data

US 2024/0069684 A1    Feb. 29, 2024

(30) Foreign Application Priority Data

Aug. 25, 2022   (KR) .................. 10-2022-0107087

(51) Int. Cl.
*G06F 3/046* (2006.01)
*H10K 59/126* (2023.01)
(Continued)

(52) U.S. Cl.
CPC .......... *G06F 3/046* (2013.01); *H10K 59/126* (2023.02); *H10K 59/40* (2023.02); *H10K 59/65* (2023.02);
(Continued)

(58) Field of Classification Search
CPC .................. G06F 3/046; G06F 3/0412; G06F 2203/04102; G06F 2203/04106;
(Continued)

(56) References Cited

U.S. PATENT DOCUMENTS 4,723,836 A * 2/1988 Kono ...................... G06F 3/046
349/59
4,845,478 A * 7/1989 Taguchi .................. G06F 3/043
345/173
(Continued)

FOREIGN PATENT DOCUMENTS

KR      10-0568019        7/2006
KR      10-2022-00163     2/2022
(Continued)

*Primary Examiner* — Jose R Soto Lopez
(74) *Attorney, Agent, or Firm* — F. CHAU & ASSOCIATES, LLC

(57) ABSTRACT

A display device includes a display panel with a folding area between two non-folding areas. A window is on the display panel. A first adhesive layer is between the window and the display panel, and has a first thickness. A lower structure is under the display panel. The lower structure includes a first support layer overlapping the first non-folding area and the second-non-folding area, a digitizer under the first support layer, including a loop coil, and overlapping the first non-folding area and the second non-folding area, an electromagnetic shielding layer under the digitizer having a second thickness, a metal layer under the electromagnetic shielding layer, and an insulating second support layer under the metal layer. The first thickness is about 75 μm to about 100 μm, and the second thickness is about 30 μm to about 60 μm.

25 Claims, 15 Drawing Sheets

(51) Int. Cl.
*H10K 59/40* (2023.01)
*H10K 59/65* (2023.01)
*H10K 77/10* (2023.01)
*G06F 3/041* (2006.01)
*H10K 102/00* (2023.01)

(52) U.S. Cl.
CPC .......... *H10K 77/111* (2023.02); *G06F 3/0412* (2013.01); *G06F 2203/04102* (2013.01); *G06F 2203/04106* (2013.01); *G06F 2203/04107* (2013.01); *H10K 2102/311* (2023.02)

(58) Field of Classification Search
CPC .......... G06F 2203/04107; G06F 3/041; H10K 59/126; H10K 59/40; H10K 59/65; H10K 77/111; H10K 2102/311; H10K 50/844; H05K 9/00; G09F 9/301; G09F 9/33
See application file for complete search history.

(56) References Cited

U.S. PATENT DOCUMENTS

| | | | | |
|---|---|---|---|---|
| 4,890,096 | A * | 12/1989 | Taguchi | G06F 3/046 345/174 |
| 6,280,552 | B1 * | 8/2001 | Bottari | G06F 3/045 156/289 |
| 8,873,226 | B1 * | 10/2014 | Peters | G06F 1/182 361/679.01 |
| 10,251,257 | B2 * | 4/2019 | Lai | H05K 7/20445 |
| 10,861,629 | B1 * | 12/2020 | Herman | C23C 4/08 |
| 11,573,664 | B1 * | 2/2023 | Slassi | G06F 3/04184 |
| 2005/0006473 | A1 * | 1/2005 | Deguchi | G06K 7/10336 235/451 |
| 2012/0299850 | A1 * | 11/2012 | Lee | G06F 3/046 345/173 |
| 2014/0267951 | A1 * | 9/2014 | Lee | G06F 3/046 29/829 |
| 2015/0124402 | A1 * | 5/2015 | Jang | B32B 27/08 148/516 |
| 2016/0116941 | A1 * | 4/2016 | Kuwabara | G06F 1/1643 361/679.03 |
| 2016/0276744 | A1 * | 9/2016 | Manzi | G02F 1/1358 |
| 2018/0070483 | A1 * | 3/2018 | Ohishi | G06K 7/10415 |
| 2019/0132947 | A1 * | 5/2019 | Koo | G09F 9/301 |
| 2019/0197282 | A1 * | 6/2019 | Gong | G06V 40/1329 |
| 2019/0267430 | A1 * | 8/2019 | Choi | H10K 59/8722 |
| 2019/0273199 | A1 * | 9/2019 | Tajitsu | D03D 15/41 |
| 2020/0119293 | A1 * | 4/2020 | Park | H04M 1/0268 |
| 2020/0137900 | A1 * | 4/2020 | Park | H05K 5/03 |
| 2020/0161590 | A1 * | 5/2020 | Seo | H10K 59/8792 |
| 2020/0176551 | A1 * | 6/2020 | Park | H10K 59/123 |
| 2020/0209998 | A1 * | 7/2020 | Shin | G06F 3/044 |
| 2020/0225699 | A1 * | 7/2020 | Yu | G06F 1/1652 |
| 2020/0381662 | A1 * | 12/2020 | Andou | H05B 33/06 |
| 2021/0041601 | A1 * | 2/2021 | Oh | G06F 1/1609 |
| 2021/0120683 | A1 * | 4/2021 | Park | B32B 37/12 |
| 2021/0124397 | A1 * | 4/2021 | Mizoguchi | G06F 1/1681 |
| 2021/0141418 | A1 * | 5/2021 | Min | H05K 5/0017 |
| 2021/0173437 | A1 * | 6/2021 | Bae | H10K 59/40 |
| 2021/0233447 | A1 * | 7/2021 | Park | G06F 1/1616 |
| 2021/0259119 | A1 * | 8/2021 | Seo | H04M 1/0214 |
| 2021/0263563 | A1 * | 8/2021 | Tsuchihashi | G06F 1/1652 |
| 2021/0342423 | A1 * | 11/2021 | Yoneda | H01L 27/1225 |
| 2021/0359277 | A1 * | 11/2021 | Jung | H10K 59/8791 |
| 2022/0039274 | A1 | 2/2022 | Shin et al. | |
| 2022/0043535 | A1 * | 2/2022 | Ke | G06F 3/0412 |
| 2022/0075411 | A1 | 3/2022 | Lee et al. | |
| 2022/0086267 | A1 | 3/2022 | Shin et al. | |
| 2022/0129094 | A1 * | 4/2022 | Tatsuno | G06F 3/04162 |
| 2022/0147107 | A1 * | 5/2022 | Wang | G06F 1/1637 |
| 2022/0244806 | A1 * | 8/2022 | Kim | G06F 3/03545 |
| 2022/0256706 | A1 * | 8/2022 | Xiong | G06F 3/04164 |
| 2022/0283629 | A1 * | 9/2022 | Bright | G06F 3/0202 |
| 2022/0350458 | A1 * | 11/2022 | Zhu | G02F 1/13338 |
| 2023/0086418 | A1 * | 3/2023 | Strohmann | H10K 59/65 |
| 2023/0196051 | A1 * | 6/2023 | Chanthet | G06K 19/07327 235/492 |
| 2023/0354659 | A1 * | 11/2023 | Jung | H10K 59/873 |
| 2024/0078970 | A1 * | 3/2024 | Huang | H10K 59/1213 |

FOREIGN PATENT DOCUMENTS

| | | |
|---|---|---|
| KR | 10-2022-0031838 | 3/2022 |
| KR | 10-2022-0037007 | 3/2022 |

* cited by examiner

FOLDABLE DISPLAY DEVICE AND ELECTRONIC DEVICE INCLUDING THE SAME

CROSS-REFERENCE TO RELATED APPLICATIONS

This U.S. non-provisional patent application claims priority under 35 U.S.C. § 119 to Korean Patent Application No. 10-2022-0107087, filed on Aug. 25, 2022, the entire contents of which are hereby incorporated by reference.

TECHNICAL FIELD

The present disclosure herein relates to a display device and an electronic device including the same, and more particularly, to a foldable display device and an electronic device including the same.

DISCUSSION OF THE RELATED ART

A display device includes a display area that may be activated in response to an electrical signal. The display device may detect an input, such as a user's touch, applied externally through the display area, and display various images to provide information to the user. As display devices having various shapes have been recently developed, display areas having various shapes are also being implemented.

SUMMARY

A display device includes a display panel including a first non-folding area, a second non-folding area, and a folding area disposed between the first and second non-folding areas. A window is disposed on the display panel. A first adhesive layer is disposed between the window and the display panel, the first adhesive layer has a first thickness. A lower structure is disposed under the display panel. The lower structure includes a first support layer overlapping at least the first non-folding area and the second-non-folding area, a digitizer disposed under the first support layer, including a loop coil, and overlapping the first non-folding area and the second non-folding area, an electromagnetic shielding layer disposed under the digitizer and having a second thickness, a metal layer disposed under the electromagnetic shielding layer, and a second support layer disposed under the metal layer and having insulation property. The first thickness is about 75 µm to about 100 µm, and the second thickness is about 30 µm to about 60 µm.

The lower structure may further include a lower portion protection film disposed under the display panel, and a first additional adhesive layer disposed between the lower portion protection film and the first support layer. The first additional adhesive layer may be disposed directly under the lower portion protection film. The first support layer may be disposed directly under the first additional adhesive layer.

The second support layer may include polyethylene terephthalate (PET).

The first support layer may include a fiber-reinforced composite.

The lower structure may further include a magnetic field shielding sheet disposed under at least a portion of the second support layer and the electromagnetic shielding layer.

The display device may further include an upper portion film disposed between the display panel and the first adhesive layer. The upper portion film may be disposed directly under the first adhesive layer.

The window may include a thin-film glass substrate disposed on the first adhesive layer and a window protection layer disposed on the thin-film glass substrate.

The digitizer may include a first digitizer overlapping the first non-folding area, and a second digitizer overlapping the second non-folding area.

The lower structure may further include a second additional adhesive layer disposed between the digitizer and the first support layer.

The electromagnetic shielding layer may include a first electromagnetic shielding layer disposed under the first digitizer and a second electromagnetic shielding layer disposed under the second digitizer.

The metal layer may include a first metal layer disposed under the first digitizer and a second metal layer disposed under the second digitizer. The second support layer may include a 2-1st support layer disposed under the first metal layer and a 2-2nd support layer disposed under the second metal layer.

The lower structure may further include a lower portion adhesive layer disposed between the metal layer and the second support layer. The lower portion adhesive layer may be disposed directly under the metal layer and the second support layer may be disposed directly under the lower portion adhesive layer.

The first support layer may include a first support portion corresponding to the first non-folding area, a second support portion corresponding to the second non-folding area, and a folding portion disposed between the first support portion and the second support portion that includes a plurality of openings. The lower structure may further include a cover layer attached to a bottom surface of the folding portion and spaced apart from the digitizer.

At least a portion of a bottom surface of the second support layer may define a lowest surface of the lower structure.

The lower structure may include a through hole penetrating through the first support layer, the digitizer, the electromagnetic shielding layer, the metal layer, and the second support layer.

A display device includes a display panel including a first non-folding area, a second non-folding area, and a folding area disposed between the first and second non-folding areas. A window is disposed non the display panel. A lower structure is disposed under the display panel. The lower structure further includes a digitizer including a loop coil, and overlapping the first non-folding area and the second non-folding area, an electromagnetic shielding layer disposed directly under the digitizer, a metal layer disposed under the electromagnetic shielding layer, a lower portion adhesion layer disposed directly under the metal layer, and a second support layer disposed directly under the lower portion adhesive layer, and including an insulating polymer material.

The lower structure may further include a lower portion protection film disposed under the display panel, a first additional adhesive layer disposed under the lower portion protection film, a first support layer disposed under the first additional adhesive layer, and a second additional adhesive layer disposed between the digitizer and the first support layer. The first additional adhesive layer may be disposed directly under the lower portion protection film. The first support layer may be disposed directly under the first additional adhesive layer. The second additional adhesive layer may be disposed directly under the first support layer. The digitizer may be disposed directly under the second additional adhesive layer.

A thickness of the digitizer may be about 120 µm to about 180 µm, a thickness of the electromagnetic shielding layer may be about 30 µm to about 60 µm, and a thickness of the second support layer may be about 1 µm to about 10 µm.

An electronic device includes a display device including a sensing area through which an optical signal is transmitted, and a display area adjacent to the sensing area. An electronic optical module is disposed under the display device, overlapping the sensing area, and configured to receive the optical signal. The display device includes a display panel including a first non-folding area, a second non-folding area, and a folding area disposed between the first and second non-folding areas. A window is disposed on the display panel. A first adhesive layer is disposed between the window and the display panel. The first adhesive layer has a first thickness. A lower structure is disposed under the display panel. The lower structure further includes a first support layer overlapping at least the first non-folding area and the second-non-folding area, a digitizer disposed under the first support layer, including a loop coil, and overlapping the first non-folding area and the second non-folding area, an electromagnetic shielding layer disposed under the digitizer and having a second thickness, a metal layer disposed under the electromagnetic shielding layer, and an electrically insulating second support layer disposed under the metal layer. The first thickness is about 75 µm to about 100 µm, and the second thickness is about 30 µm to about 60 µm.

The lower structure may include a through hole penetrating through the first support layer, the digitizer, the electromagnetic shielding layer, the metal layer, and the second support layer.

The through hole may be aligned to the sensing area, and the electronic optical module may overlap the through hole.

The electronic optical module may include a camera module.

The display panel may include a first pixel disposed in the display area and a second pixel disposed in the sensing area.

A resolution of the display area may be larger than that of the sensing area.

Within a reference area, a light transmittance or occupation ratio (e.g., aperture ratio) of a light shielding structure in the sensing area may be smaller than that of the light shielding structure in the display area.

The sensing area may include a non-transparent area including a light-emitting element and a transparent area that does not include a light-emitting element.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1A:
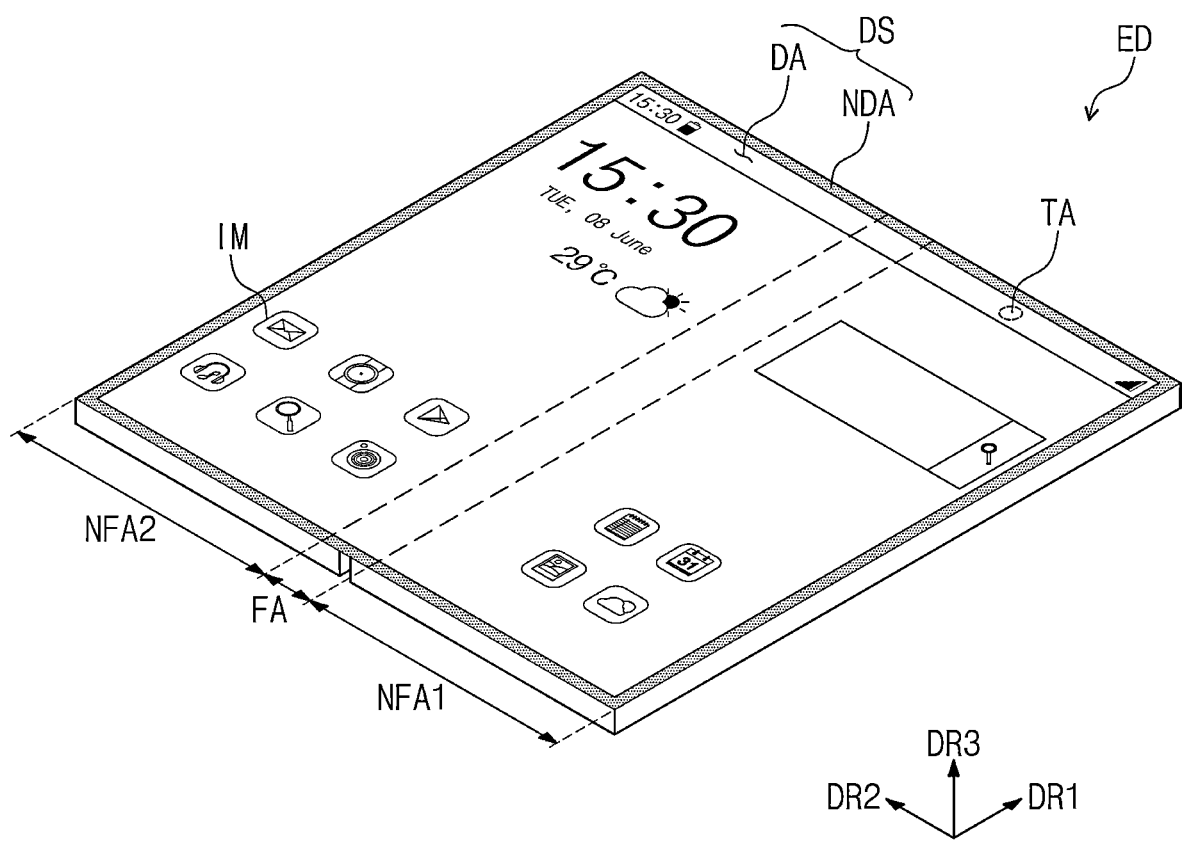
FIGS. 1A to 1C are perspective views of an electronic device according to an embodiment of the inventive concept.

It will be understood that when an element or layer is referred to as being "on", "connected to" or "coupled to" another element or layer, it can be directly on, connected or coupled to the other element or layer or intervening elements or layers may be present.

Like reference numerals in the drawings may refer to like elements. In addition, in the drawings, the thickness and the ratio and the dimension of the element may be exaggerated for effective description of the technical contents. The term "and/or" includes any and all combinations of one or more of the associated items.

Terms such as first, second, and the like may be used to describe various components, but these components should not necessarily be limited by the terms. These terms are used to distinguish one element from another. For instance, a first component may be referred to as a second component, or similarly, a second component may be referred to as a first component, without departing from the scope of the present disclosure. The singular expressions may include plural expressions unless the context clearly dictates otherwise.

In addition, the terms such as "under", "lower", "on", and "upper" are used for explaining associations of items illustrated in the drawings. It will be understood that the spatially relative terms are intended to encompass different orientations of the device in use or operation in addition to the orientation depicted in the figures.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof.

On the other hand, "being disposed directly" may means that there is not an additional layer, film, region, plate or the like between a part of a layer, film, region, plate or the like and another part. For example, "being disposed directly" may mean that disposition of two layers or two structures is performed without using an additional structure such as an adhesive disposed therebetween.

Hereinafter, embodiments of the inventive concept will be described with reference to the accompanying drawings.

Figure 1B:
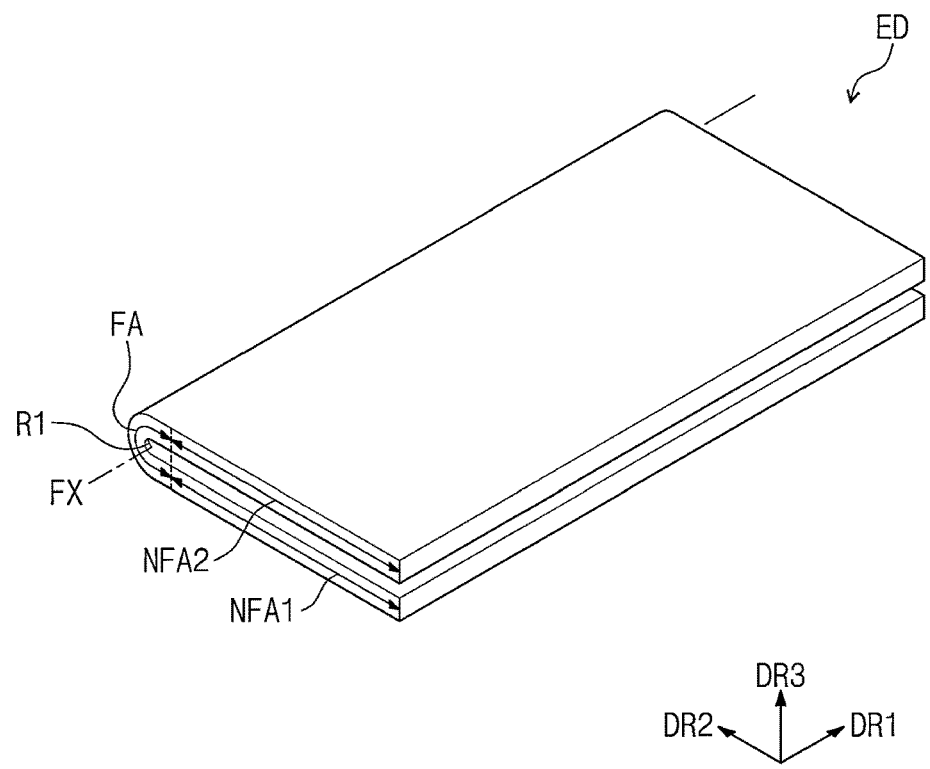
Figure 1C:
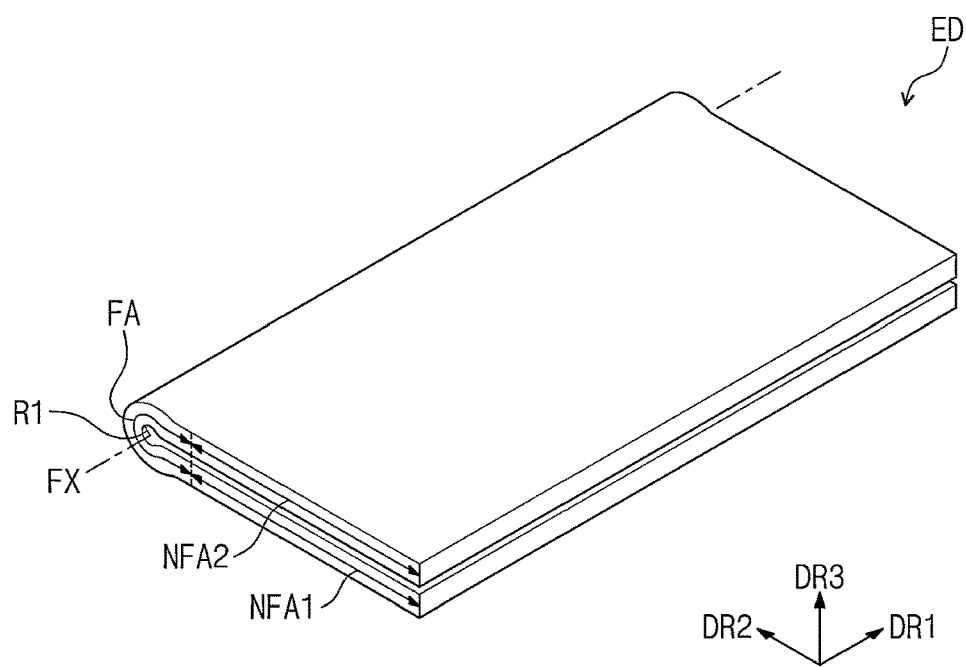

FIGS. 1A to 1C are perspective views of an electronic device according to an embodiment of the inventive concept. FIG. 1A shows an unfolded state, and FIGS. 1B and 1C shows a folded state.

Referring to FIGS. 1A to 1C, the electronic device ED, according to the embodiment, may include a display surface DS that is in a plane of ma first direction DR1 and a second direction DR2 that crosses the first direction DR1. The electronic device ED may provide a user with an image IM through the display surface DS.

The display surface DS may include a display area DA and a non-display area NDA at least partially surrounding the display area DA. The image IM may be displayed in the display area DA and might not be displayed in the non-display area NDA. The non-display area NDA may surround the display area DA. However, the embodiment of the inventive concept is not necessarily limited thereto, and the shapes of the display area DA and the non-display area NDA may be different from what is shown.

The display surface DS may include a sensing area TA. The sensing area TA may be a portion of the display area DA. The sensing area TA may have a higher light transmittance than the other area of the display area DA. Hereinafter, the other area of the display area DA excluding the sensing area TA may be defined as a typical display area.

An optical signal, for example, visible light or infrared light may be shifted. The electronic device ED may capture an external image through the visible light passing through the sensing area TA, or determine accessibility of an external object through the infrared light. In FIG. 1A, an example sensing area TA is shown, but the embodiment of the inventive concept is not necessarily limited thereto. The sensing area TA may be provided in plural.

Hereinafter, a direction, which substantially vertically crosses a plane defined by the first and second directions DR1 and DR2, is defined as a third direction DR3. The third direction DR3 corresponds to a reference direction to distinguish a front surface from a rear surface of each element. In the specification, the expression "in a plan view" may mean a state of being viewed in the third direction DR3. Hereinafter, like reference numerals are referred in the first to third directions DR1, DR2, and DR3 indicated by the first to third directional axes, respectively.

The electronic device ED may include a folding area FA and a plurality of non-folding areas NFA1 and NFA2. The non-folding areas NFA1 and NFA2 may include a first non-folding area NFA1 and a second non-folding area NFA2. In the second direction DR2, the folding area FA may be disposed between the first non-folding area NFA1 and the second non-folding area NFA2.

As shown in FIG. 1B, the folding area FA may be folded on the basis of a folding axis FX parallel to the first direction DR1. The folding area FA has a prescribed curvature and a prescribed radius of curvature R1. The first non-folding area NFA1 and the second non-folding area NFA2 may face each other, and the electronic device ED may be inner-folded so that the display surface DS is not exposed to the outside.

In an embodiment of the inventive concept, the electronic device ED may be outer-folded so that the display surface DS is exposed to the outside. In an embodiment of the inventive concept, the electronic device ED may be configured so that the inner-folding operation and the outer-folding operation are alternately repeated from an unfolding operation, but the embodiment of the inventive concept is not necessarily limited thereto. In an embodiment of the inventive concept, the electronic device ED may be configured to select any one of the unfolding operation, the inner-folding operation, or the outer-folding operation.

As shown in FIG. 1B, the distance between the first non-folding area NFA1 and the second non-folding area NFA2 may be substantially the same as the radius of curvature R1, but as shown in FIG. 1C, the distance between the first non-folding area NFA1 and the second non-folding area NFA2 may be smaller than the radius of curvature R1. FIGS. 1B and 1C are shown on the basis of the display surface DS, and a housing HM (see FIG. 2A) showing the appearance of the electronic device ED may contact in terminal areas of the first non-folding area NFA1 the second non-folding area NFA2.

Figure 2A:
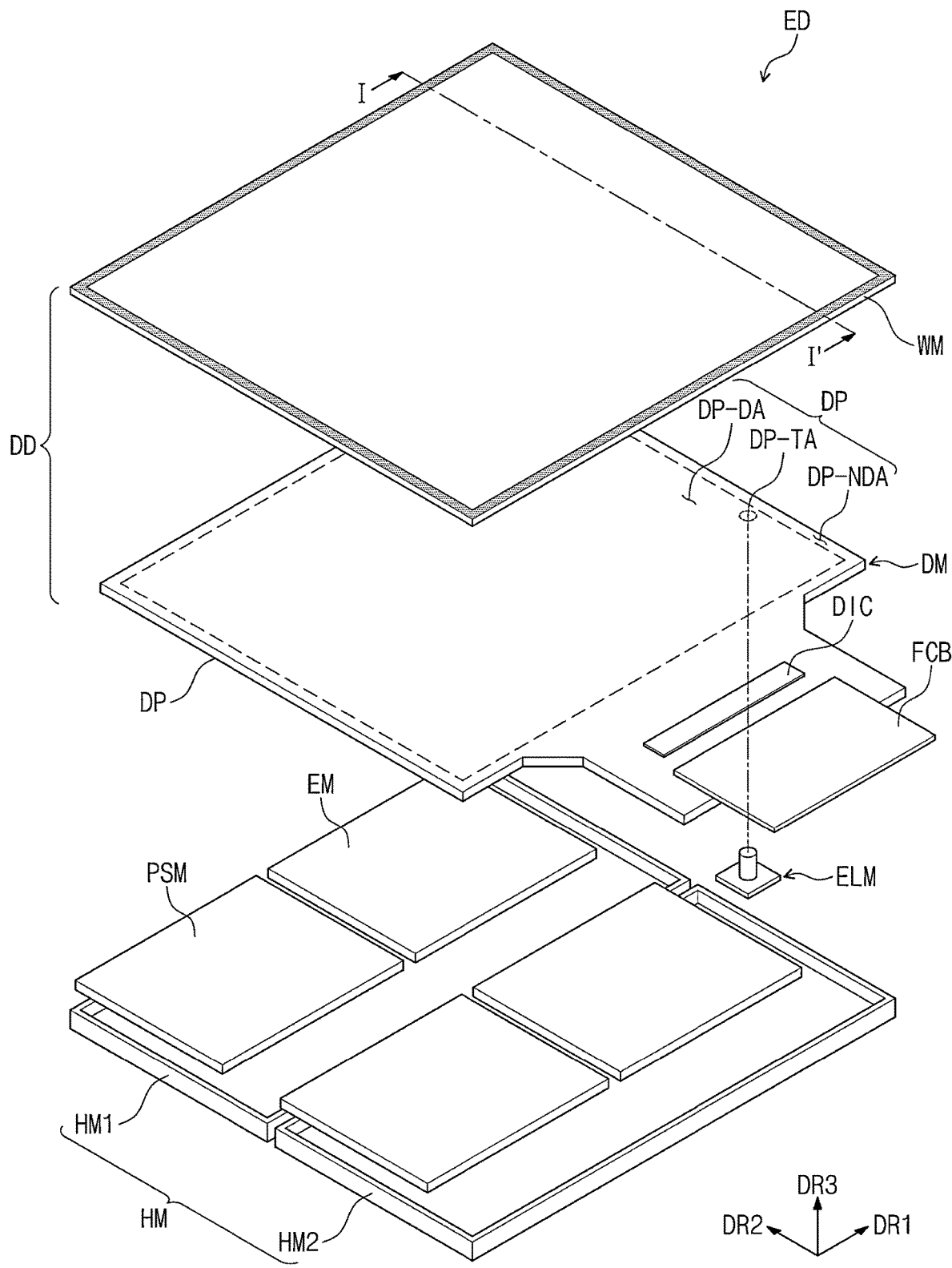
FIG. 2A is an exploded perspective view of an electronic device according to an embodiment of the inventive concept.
Figure 2B:
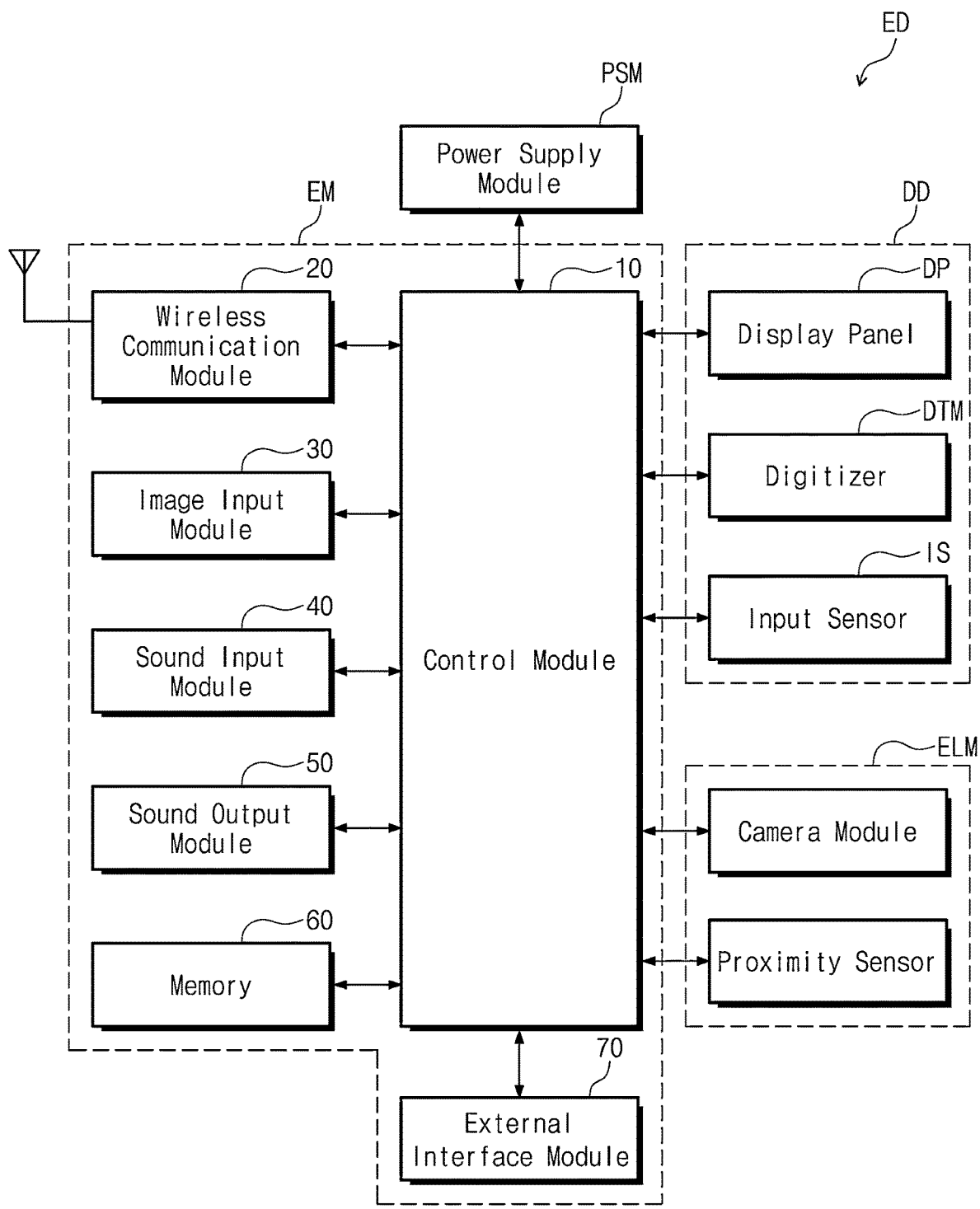
FIG. 2B is a block diagram of an electronic device according to an embodiment of the inventive concept.

FIG. 2A is an exploded perspective view of an electronic device according to an embodiment of the inventive concept. FIG. 2B is a block diagram of an electronic device according to an embodiment of the inventive concept.

As shown in FIGS. 2A and 2B, the electronic device ED may include a display device DD, an electronic module EM, an electro-optical module ELM, a power supply module PSM, and the housing HM. The electronic device ED may further include a mechanism structure for controlling the folding operation of the display device DD.

The display device DD generates an image and detects an external input. The display device DD includes a window WM and a display module DM. The window WM provides the front surface of the electronic device ED. A detailed description about the window WM will be provided below.

The display module DM may include at least a display panel DP. FIG. 2A illustrates only the display panel DP among a laminated structure of the display module DM, but in substance, the display module DM may further include a plurality of components disposed in an upper side of the display panel DP. The laminated structure of the display module DM will be described in detail below.

The display panel DP is not particularly limited to the arrangement shown, and may be, for example, an emissive display panel such as an organic light emitting display panel or an inorganic light emitting display panel. The display panel DP may be a display panel including an ultra-small light-emitting element such as a micro LED or a nano LED.

The display panel DP may include a display area DP-DA and a non-display area DP-NDA respectively corresponding to the display area DA (see FIG. 1A) and the non-display area NDA (see FIG. 1A) of the electronic device ED. In the present specification, "an area/portion corresponds to an area/portion" means overlapping, and the overlapping is not necessarily limited to the same area.

The display panel DP may include a sensing area DP-TA corresponding to the sensing area TA in FIG. 1A. The sensing area DP-TA may have a lower resolution than the display area DP-DA. A detailed description about the sensing area DP-TA will be provided below.

As shown in FIG. 2A, a driving chip DIC may be disposed on the non-display area DP-NDA of the display panel DP. A flexible circuit board FCB may be bonded to the non-display area DP-NDA of the display panel DP. The flexible circuit board FCB may be connected to a main circuit board. The main circuit board may be an electronic component configuring an electronic module EM.

The driving chip DIC may include driving elements, for example, a data driving circuit for driving pixels of the display panel DP. FIG. 2A shows a structure in which the driving chip DIC is mounted on the display panel DP, but the embodiment of the inventive concept is not necessarily limited thereto. For example, the driving chip DIC may be mounted on the flexible circuit board FCB.

As shown in FIG. 2B, the display device DD may further include an input sensor IS and a digitizer DTM. The input sensor IS senses an input of a user. The input sensor IS of an electrostatic capacitive type may be disposed on an upper side of the display panel DP. The digitizer DTM senses an input from a stylus pen. The digitizer DTM of an electromagnetic induction type may be disposed on a lower side of the display panel DP.

The electronic module EM may include a control module 10, a wireless communication module 20, an image input module 30, a sound input module 40, a sound output module 50, a memory 60, an external interface module 70 or the like. The electronic module EM may include the main circuit board, and the modules may be mounted on the main circuit board or electrically connected to the main circuit board through the flexible circuit board FCB. The electronic module EM is electrically connected to the power supply modules PSM.

Referring to FIG. 2B, the electronic module EM may be provided in plural to be respectively disposed in a first housing HM1 and a second housing HM2, and the power supply modules PSM may be provided in plural to be respectively disposed in the first housing HM1 and the second housing HM2. The electronic module EM disposed in the first housing HM1 and the electronic module EM disposed in the second housing HM2 may be electrically connected through the flexible circuit board FCB.

The control module 10 controls the overall operations of the electronic device ED. For example, the control module 10 activates or deactivates the display device DD in correspondence to a user input. The control module 10 may control the image input module 30, the sound input module 40, the sound output module 50 or the like in correspondence to a user input. The control module 10 may include at least one microprocessor.

The wireless communication module 20 may transmit/receive a wireless signal to/from another terminal using Bluetooth or Wi-Fi. The wireless communication module 20 may transmit/receive a voice signal using a typical communication line. The wireless communication module 20 may include a plurality of antenna modules.

The image input module 30 processes and converts an image signal to image data that may be displayed on the display device DD. The sound input module 40 receives an external sound signal through a microphone in a recording mode or a voice recognition mode to convert the sound signal to electrical voice data. The sound output module 50 converts sound data received from the wireless communication module 20 or sound data stored in the memory 60 to a sound signal, and outputs the sound signal to the outside.

The external interface 70 may serve as an interface connected to an external charger, a wired/wireless data port, or a card socket (e.g., a memory card or a SIM/UIM card), etc.

The power supply module PSM supplies power necessary for the overall operations of the electronic device ED. The power supply module PSM may include a typical battery device.

The electro-optical module ELM may be an electronic component configured to output or receive an optical signal. The electro-optical module ELM may include a camera module and/or a proximity sensor. The camera module captures an external image through the sensing area DP-TA.

The housing HM shown in FIG. 2A is combined with the display device DD, in particular, with the window WM to accommodate the other modules. The housing HM is shown to include the first and second housings HM1 and HM2 that are spaced apart from each other, but is not necessarily limited thereto. The electronic device ED may further include a hinge structure for connecting the first and second housings HM1 and HM2.

Figure 3A:
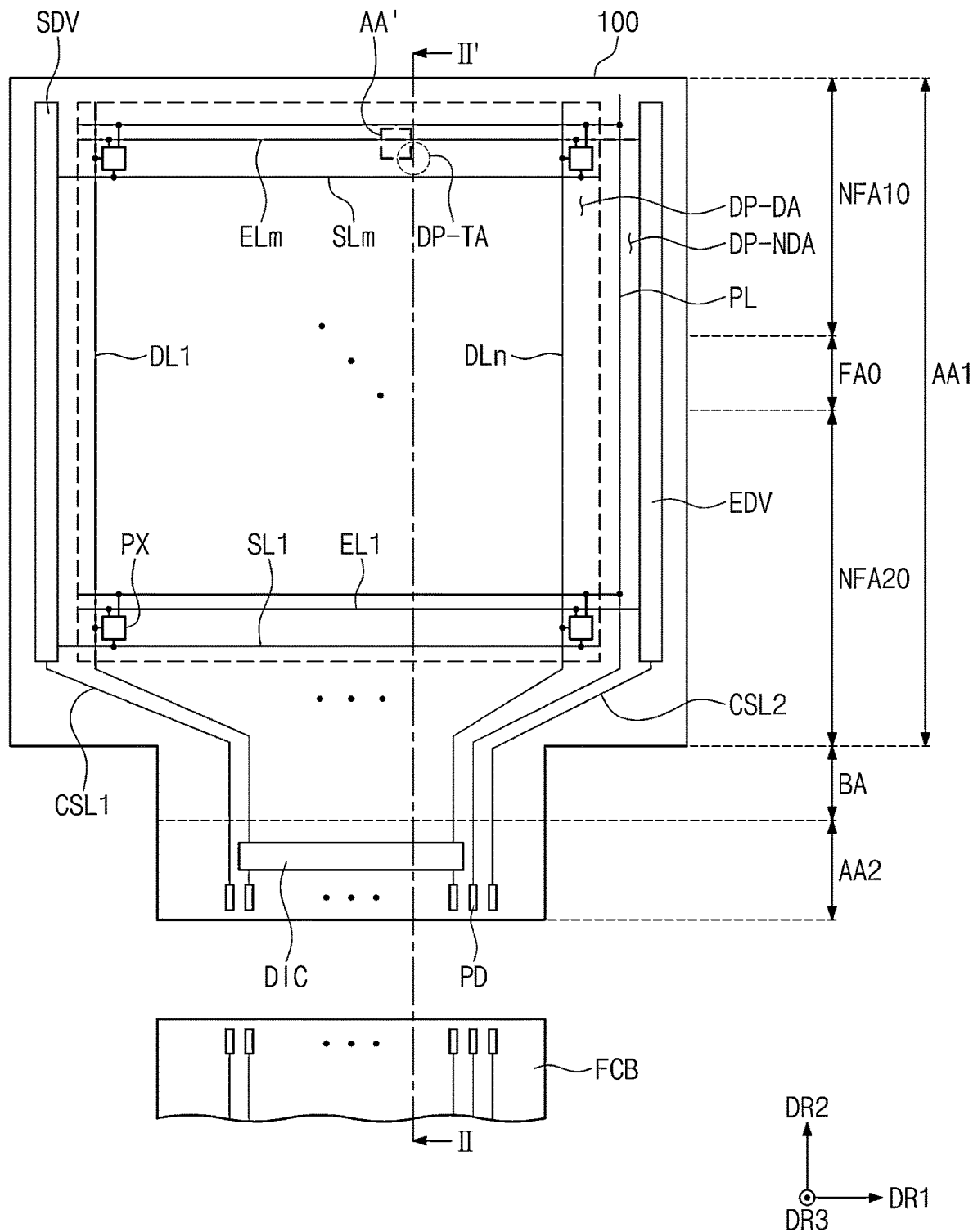
FIG. 3A is a plan view of a display panel according to an embodiment of the inventive concept.
Figure 3B:
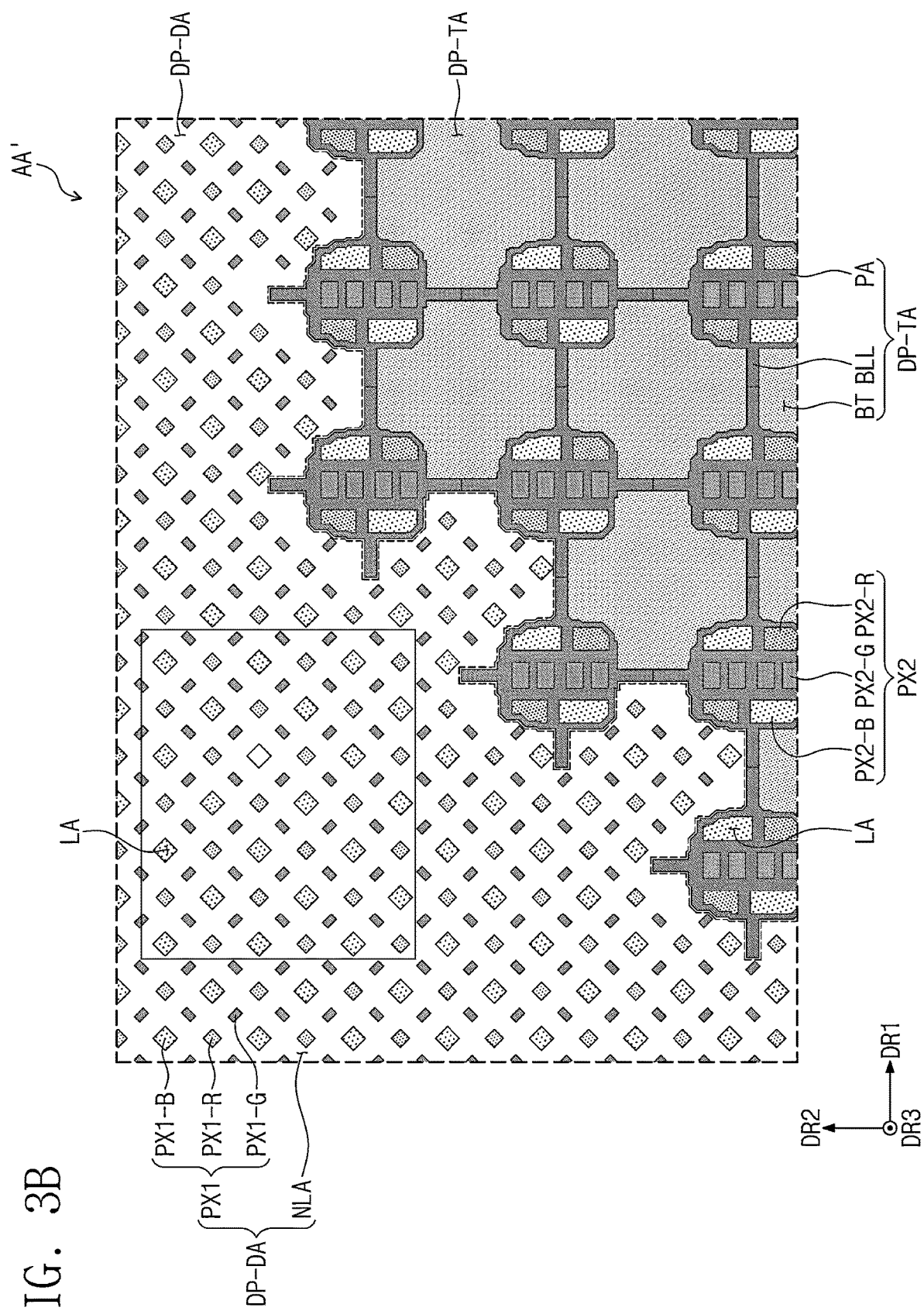
FIG. 3B is a plan view of a section of a display panel according to an embodiment of the inventive concept.

FIG. 3A is a plan view of a display panel according to an embodiment of the inventive concept. FIG. 3B is a plan view of a section of a display panel according to an embodiment of the inventive concept. FIG. 3B is an enlarged plan view of a section AA' in FIG. 3A.

Referring to FIG. 3A, the display panel DP may include the display area DP-DA and the non-display area DP-NDA at least partially surrounding the display area DP-DA. The display area DP-DA and the non-display area DP-NDA may be divided by the presence of pixels. The pixels PX are disposed in the display area DP-DA. The non-display area DP-NDA may include a scan driver SDV, a data driver, and an emission driver EDV. The data driver may be a partial circuit configured in the driving chip DCI shown in FIG. 3A.

The display panel DP includes a first area AA1, a second area AA2, and a bending area BA divided in the second direction DR2. The second area AA2 and the bending area BA may be sections of the non-display area DP-NDA. The bending area BA is disposed between the first area AA1 and the second area AA2.

The first area AA1 corresponds to the display surface DS of FIG. 1A. The first area AA1 may include a first non-folding area NFA10, a second non-folding area NFA20, and a folding area FAO. The first non-folding area NFA10, the second non-folding area NFA20, and the folding area FAO may respectively correspond to the first non-folding area NFA1, the second non-folding area NFA2, and the folding area FA of FIGS. 1A to 1C.

The lengths of the bending area BA and the second area AA2 in the second direction DR2 may be smaller than that of the first area AA1. An area in which the length in a bending axis direction is shorter may be bent more easily.

The display panel DP may include a plurality of pixels PX, a plurality of scan lies SL1 to SLm, a plurality of data lines DL1 to DLn, a plurality of emission lines EL1 to ELm, first and second control lines CSL1 and CSL2, a power line PL, and a plurality of pads PD. Here, m and n are positive integers. The pixels PX may be electrically connected to the scan lines SL1 to SLm, the data lines DL1 to DLn, and the emission lines Ell to ELm.

The scan lines SL1 to SLm may extend in the second direction DR2 to be electrically connected to the scan driver SDV. The data lines DL1 to DLn may extend in the second direction DR2 to be electrically connected to the data driver DIC via the bending area BA. The emission lines EL1 to ELm may extend in the second direction DR1 to be electrically connected to the emission driver EDV.

The power line PL may include a portion extending in the second direction DR2 and a portion extending in the first direction DR1. The portion extending in the first direction DR1 and the portion extending in the second direction DR2 may be disposed on different layers. The portion, extending in the second direction DR2, of the power line PL may extend to the second area AA2 via the bending area BA. The power line PL may provide a first voltage to the pixels PX.

The first control line CSL1 may be electrically connected to the scan driver SDV, and may extend towards a lower end of the second area AA2 via the bending area BA. The second control line CSL2 may be electrically connected to the emission driver EDV and may extend towards the lower end of the second area AA2 via the bending area BA.

In a plan view, the pads PD may be disposed adjacent to the lower end of the second area AA2. The driving chip DIC, the power line PL, the first control line CSL1, and the second control line CSL2 may be electrically connected to the pads PD. The flexible circuit board FCB may be electrically connected to the pads PD through an anisotropic conductive adhesive layer.

Referring to FIG. 3B, the sensing area DP-TA may have a higher light transmittance and a lower resolution than the display area DP-DA. The light transmittance and resolution are measured within the reference area. The sensing area DP-TA has a smaller light transmittance or occupancy ratio (e.g., aperture ratio) of a light shielding structure within the reference area than the display area DP-DA. The light shielding structure may include a conductive pattern of a circuit layer, electrodes of a light-emitting element, a light shielding pattern or the like to be described below.

The sensing area DP-TA has a lower resolution within the reference area than the display area DP-DA. The sensing area DP-TA has a smaller number of pixels included within the reference area (or the same area) than the display area DP-DA.

As shown in FIG. 3B, a first pixel PX1 may be disposed in the display area DP-DA, and a second pixel PX2 may be disposed in the sensing area DP-TA. The first pixel PX1 and the second pixel PX2 may have different light-emitting areas, when the areas of the same color pixels are compared. The first pixel PX1 and the second pixel PX2 may have different arrangements.

FIG. 3B shows emission areas LA of the first pixel PX1 and the second pixel PX2 as representatives of the first pixel PX1 and the second pixel PX2. Each of the light-emitting areas LA may be defined as an area in which an anode of the light-emitting element is exposed from a pixel definition layer. A non-light emitting area NLA is disposed between the light-emitting areas LA within the display area DP-DA.

The first pixel PX1 may include a first color pixel PX1-R, a second color pixel PX1-G, and a third color pixel PX1-B, and the second pixel PX2 may include a first color pixel PX2-R, a second color pixel PX2-G, and a third color pixel PX2-B. Each of the first pixel PX1 and the second pixel PX2 may include a red pixel, a green pixel, and a blue pixel.

The sensing area DP-TA may include a pixel area PA, a wiring area BLL, and a transmission area BT. The second pixel PX2 is disposed within the pixel area PA. It is illustrated that two first color pixels PX2-R, four second color pixels PX2-G, and two third color pixels PX2-B are disposed in one pixel area PA. However, the embodiment of the inventive concept is not necessarily limited thereto.

In the pixel area PA and the wiring area BLL, the conductive pattern related to the second pixel PX2, the signal line, or the light shielding pattern are disposed. The light shielding pattern may be a metal pattern, and substantially overlap the pixel area PA and the wiring area BLL. The pixel area PA and the wiring area BLL may be non-transmission areas.

The transmission area BT is an area through which an optical signal substantially passes. Since the second pixel PX2 is not disposed in the transmission area BT, the conductive pattern, the signal line, or the light shielding pattern is disposed. Accordingly, the transmission area BT increases the light transmittance of the sensing area DP-TA.

Figure 4:
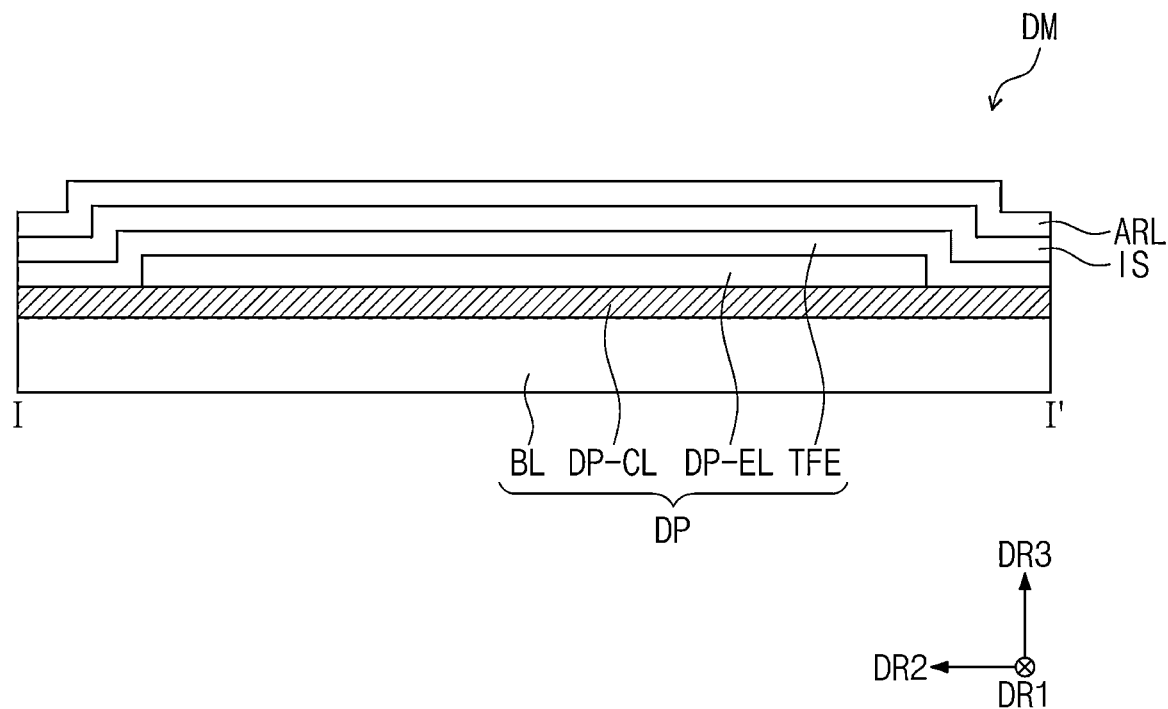
FIG. 4 is a cross-sectional view of a display module according to an embodiment of the inventive concept.

FIG. 4 is a cross-sectional view of a display module according to an embodiment of the inventive concept.

Referring to FIG. 4, the display module DM may include a display panel DP, an input sensor IS, and an anti-reflection layer ARL. The display panel DP may include a base layer BL, a circuit layer DP-CL, a light-emitting element layer DP-EL, and an encapsulation layer TFE.

The base layer BL may provide a base surface having the circuit layer DP-CL disposed thereon. The base layer BL may be a flexible substrate that is bendable, foldable, rollable or the like. The base layer BL may be a glass substrate, a metal substrate, a polymer substrate or the like. However, the embodiment of the inventive concept is not necessarily limited thereto, and the base layer BL may be an inorganic layer, an organic layer, or a composite material layer.

The base layer BL may have a multilayer structure. For example, the base layer BL may include a first synthetic resin layer, an inorganic layer of a single layer or multiple layers, and a second synthetic resin layer disposed on the inorganic layer of a single layer or multiple layers. Each of the first and second synthetic resin layers may include a polyimide-based resin, but is not particularly limited thereto.

The circuit layer DP-CL may be disposed on the base layer BL. The circuit layer DP-CL may include an insulation layer, a semiconductor pattern, a conductive pattern, a signal line and the like.

The light-emitting layer DP-EL may be disposed on the circuit layer DP-CL. The light-emitting layer DP-EL may include a light emitting element. For example, the light-emitting element may include an organic light-emitting material, an inorganic light-emitting material, an organic-inorganic light-emitting material, quantum dots, quantum rods, micro-LEDs, or nano-LEDs.

The encapsulation layer TFE may be disposed on the light-emitting element layer DP-EL. The encapsulation layer TFE may protect the light-emitting element layer DP-EL from a foreign matter such as moisture, oxygen and dust particles. The encapsulation layer TFE may include at least one inorganic layer. The encapsulation layer TFE may include a laminated structure of an inorganic layer/an organic layer/an inorganic layer.

The input sensor IS may be disposed directly on the display panel DP. The display panel DP and the input sensor IS may be provided through continuous processes. Here, "to be disposed directly" may mean that a third component is not disposed between the input sensor IS and the display panel DP. A separate adhesive layer might not be disposed between the input sensor IS and the display panel DP.

The anti-reflection layer ARL may be disposed directly on the input sensor IS. The anti-reflection layer ARL may reduce a reflection ratio of external light incident from the outside of the display device DD. The anti-reflection layer ARL may include color filters. The color filters may have a prescribed arrangement. For example, the color filters may be arranged in consideration of emission colors of the pixels included in the display panel DP. In addition, the anti-reflection layer ARL may further include a black matrix adjacent to the color filters.

In an embodiment of the inventive concept, the positions of the input sensor IS and the anti-reflection layer ARL may be exchanged with each other. In an embodiment of the inventive concept, the anti-reflection layer ARL may be replaced with a polarization film. The polarization film may be bonded to the input sensor IS through an adhesive layer.

Figure 5:
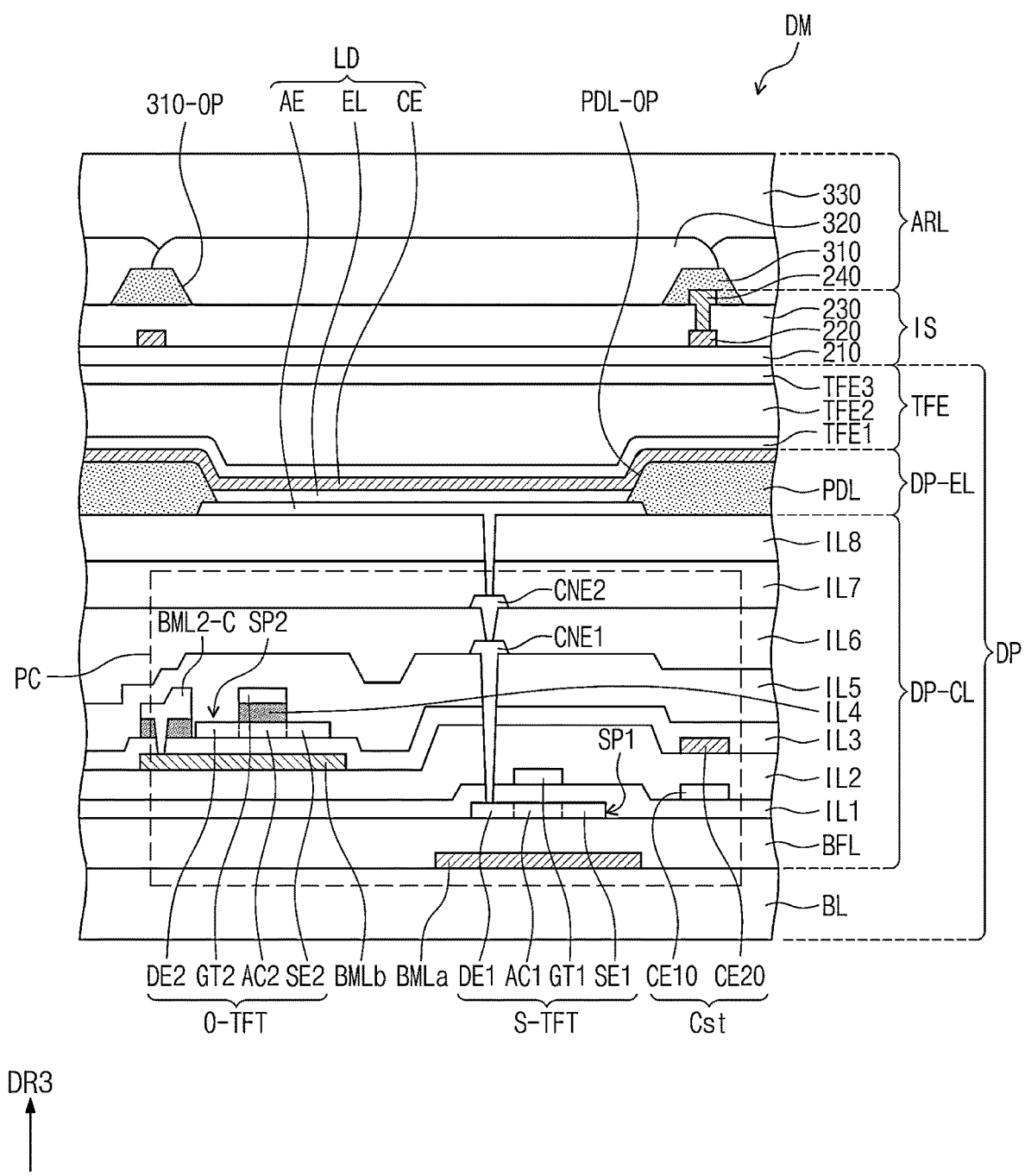
FIG. 5 is a cross-sectional view of a portion of a display module according to an embodiment of the inventive concept.

FIG. 5 is a cross-sectional view of a portion of a display module according to an embodiment of the inventive concept. In FIG. 5, a portion of the display module DM shown in FIG. 4 is illustrated in detail. For example, in FIG. 5, components corresponding to one pixel in the display module DM according to an embodiment are illustrated in detail.

In FIG. 5, one light-emitting element LD, and a pixel circuit PC including a silicon transistor S-TFT and an oxide transistor O-TFT are shown. At least one of the plurality of transistors included in the pixel circuit PC may be the oxide transistor O-TFT, and the other transistors may be silicon-transistors S-TFT.

A buffer layer BFL may be disposed on the base layer BL. The buffer layer BFL may prevent metal atoms or impurities from being diffused from the base layer BL to a first semiconductor pattern SP1 in an upper side. The first semiconductor pattern SP1 may include an active area AC1 of the silicon transistor S-TFT. The buffer layer BFL may adjust a heat providing rate to allow the first semiconductor pattern to be provided uniformly during a crystallization process of providing the first semiconductor pattern SP1.

A first rear surface metal layer BMLa is disposed under the silicon transistor S-TFT, and a second rear surface metal layer BMLb is disposed under the oxide transistor O-TFT. The first and second rear surface metal layers BML1 and BMLb may overlap the pixel circuit PC. The first and second rear surface metal layers BML1 and BMLb may be block external light from reaching the pixel circuit PC.

The first rear surface metal layer BMLa may correspond to at least a section of the pixel circuit PC. The first rear surface metal layer BMLa may overlap a driving transistor implemented with the silicon transistor S-TFT.

The first rear surface metal layer BMLa may be disposed between the base layer BL and the buffer layer BFL. In an embodiment of the inventive concept, an inorganic barrier layer may be further disposed between the first rear surface metal layer BMLa and the buffer layer BFL. The first rear surface metal layer BMLa may be electrically connected with an electrode or a wiring, and receive a constant voltage or a signal therefrom. In an embodiment of the inventive concept, the first rear surface metal layer BMLa may be a floating electrode of an isolated type from another electrode or wiring.

The second rear surface metal layer BMLb may be disposed under the oxide transistor O-TFT. The second rear surface metal layer BMLb may be disposed between a second insulation layer IL2 and a third insulation layer IL3. The second rear surface metal layer BMLb may be disposed on the same layer as a second electrode CE20 of a storage capacitor Cst. The second rear surface metal layer BMLb may be electrically connected with a contact electrode BML2-C to be applied with a constant voltage or a signal. The contact electrode BML2-C may be disposed on the same layer as a gate GT2 of the oxide transistor O-TFT.

Each of the first rear surface metal layer BMLa and the second rear surface metal layer BMLb may include a reflective metal. For example, each of the first rear surface metal layer BMLa and the second rear surface metal layer BMLb may include silver (Ag), an alloy containing silver (Ag), molybdenum (Mo), an alloy containing molybdenum (Mo), aluminum (Al), an alloy containing aluminum (Al), aluminum nitride (AlN), tungsten (W), tungsten nitride (WN), copper (Cu), p+-doped amorphous silicon or the like. The first and second rear surface metal layers BMLa and BMLb may include the same material, or different materials from one another.

The second rear surface metal layer BMLb may be omitted according to an embodiment of the inventive concept. The first rear surface metal layer BMLa may extend under the oxide transistor O-TFT, and block light incident into the lower side of the oxide transistor O-TFT.

The first semiconductor pattern SP1 may be disposed on the buffer layer BFL. The first semiconductor pattern SP1 may include a silicon semiconductor. For example, the silicon semiconductor may include amorphous silicon, polycrystalline, or the like. For example, the first semiconductor pattern SP1 may include low temperature polysilicon.

FIG. 5 illustrates a portion of the first semiconductor pattern SP1 disposed on the buffer layer BFL, and the first semiconductor pattern SP1 may be further disposed in another area. The first semiconductor pattern SP1 may be arranged in a specific rule across the pixels. The first semiconductor pattern SP1 may have different electrical properties according to whether it is doped. The first semiconductor pattern SP1 may include a first area having high electrical conductivity and a second area having low electrical conductivity. The first area may be doped with an N-type dopant or a P-type dopant. A P-type transistor includes a doped region doped with a P-type dopant, and an N-type transistor includes a doped area doped with an N-type dopant. The second area may be a non-doped area, or be doped at a lower concentration in comparison to the first area.

The first area may have a greater electrical conductivity than the second area, and substantially operate as an electrode or a signal line. The second area may substantially correspond to an active area (or a channel) of a transistor. A portion of the first semiconductor pattern SP1 may be an active area of the transistor, another portion may be a source or drain of the transistor, and still another portion may be a connection electrode or a signal connection line.

A source area SE1 (or a source), the active area AC1 (or a channel), and a drain area DE1 (or a drain) of the silicon transistor S-TFT may be provided from the first semiconductor pattern SP1. The source area SE1 and the drain area DE1 may extend in opposite directions from each other from the active area AC1 on a cross section.

The first insulation layer IL1 may be disposed on the buffer layer BFL. The first insulation layer IL1 may commonly overlap the plurality of pixels and cover the first semiconductor pattern SP1. The first insulation layer IL1 may include an inorganic material and/or organic material, and have a single layer or multilayer structure. The first insulation layer IL1 may include aluminum oxide, titanium oxide, silicon oxide, silicon nitride, silicon oxynitride, zirconium oxide, and/or hafnium oxide. In the embodiment, the first insulation layer IL1 may be a single layer of silicon oxide. Not only the first insulation layer IL1, but also an insulation layer of the circuit layer DP-CL to be described below may include an inorganic layer and/or an organic layer, and have a single layer or multilayer structure. The inorganic material layer may include at least one of the aforementioned materials, but is not necessarily limited thereto.

The gate GT1 of the silicon transistor S-TFT may be disposed on the first insulation layer IL1. The gate GT1 may be a portion of a metal pattern. The gate GT1 may overlap the active area AC1. The gate GT1 may serve as a mask in a process of doping the first semiconductor pattern SP1. The gate GT1 may include titanium (Ti), silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), indium tin oxide (ITO), indium zinc oxide (IZO), or the like, but is not necessarily particularly limited thereto.

The second insulation layer IL2 may be disposed on the first insulation layer IL1 and may cover the gate GT1. A third insulation layer IL3 may be disposed on the second insulation layer IL2. The second electrode CE20 of the storage capacitor Cst may be disposed between the second insulation layer IL2 and the third insulation layer IL3. In addition, a first electrode CE10 of the storage capacitor Cst may be disposed between the first insulation layer IL1 and the second insulation layer IL2.

A second semiconductor pattern SP2 may be disposed on the third insulation layer IL3. The second semiconductor pattern SP2 may include an active area AC2 of the oxide transistor O-TFT to be described below. The second semiconductor pattern SP2 may include an oxide semiconductor. For example, the second oxide semiconductor pattern SP2 may include a transparent conductive oxide (TCO) such as indium tin oxide (ITO), indium zinc oxide (IZO), indium gallium zinc oxide (IGZO), zinc oxide (ZnO) or indium oxide ($In_2O_3$) or the like.

The oxide semiconductor may include a plurality of areas divided according to whether a TCO is reduced. A zone (hereinafter, a reduction zone) in which the TCO is reduced has a high electrical conductivity in comparison to a zone (hereinafter, a non-reduction zone) in which the TCO is not reduced. The reduction zone may substantially serve as a source/drain or a signal line of the transistor. The non-reduction zone substantially corresponds to a semiconductor area (or the active area, or the channel) of the transistor. A section of the second semiconductor pattern SP2 may be a semiconductor area of the transistor, another portion may be the source/drain of the transistor, and still another portion may be a signal transfer area.

A source area SE2 (or a source), the active area AC2 (or a channel), and a drain area DE2 (or a drain) of the oxide transistor O-TFT may be provided from the second semiconductor pattern SP2. The source area SE2 and the drain area DE2 may extend in opposite directions from each other from the active area AC2 on a cross section.

A fourth insulation layer IL4 may be disposed on the third insulation layer IL3. As shown in FIG. 5, the fourth insulation layer IL4 may be an insulation pattern that overlaps the gate GT2 of the oxide transistor O-TFT, and exposes the source area SE2 and the drain area DE2 of the oxide transistor O-TFT. As shown in FIG. 5, the fourth insulation layer IL4 may cover the second semiconductor pattern SP2.

As shown in FIG. 5, the gate GT2 of the oxide transistor O-TFT may be disposed on the fourth insulation layer IL4. The gate GT2 of the oxide transistor O-TFT may be a portion of the metal pattern. The gate GT2 of the oxide transistor O-TFT overlaps the active area AC2.

A fifth insulation layer IL5 may be disposed on the fourth insulation layer IL4 and may cover the gate GT2. The first connection electrode CNE1 may be disposed on the fifth insulation layer IL5. The first connection electrode CNE1 may be electrically connected to the drain area DE1 of the silicon transistor S-TFT through a contact hole penetrating through the first to fifth insulation layers IL1, IL2, IL3, IL4, and IL5.

A sixth insulation layer IL6 may be disposed on the fifth insulation layer IL5. A second connection electrode CNE2 may be disposed on the sixth insulation layer IL6. The second connection electrode CNE2 may be electrically connected to the first connection electrode CNE1 through a contact hole penetrating through the sixth insulation layer IL6. A seventh insulation layer IL7 may be disposed on the sixth insulation layer IL6 and may cover the second connection electrode CNE2. An eighth insulation layer IL8 may be disposed on the seventh insulation layer IL7.

Each of the sixth to eighth insulation layer IL6 to IL8 may be an organic layer. For example, each of the sixth to eighth insulation layers IL6 to IL8 may include a general purpose polymer such as Benzocyclobutene (BCB), polyimide, Hexamethyldisiloxane (HMDSO), Polymethylmethacrylate (PMMA), or Polystyrene (PS), a polymer derivative having a phenol group, an acryl-based polymer, an imide-based polymer, an allyl ether-based polymer, an amide-based polymer, a fluorine-based polymer, a p-xylene-based polymer, a vinylalcohol-based polymer, a blend thereof or the like.

The light emitting element LD may include a first electrode AE, a light emitting layer DP-EL, and a second electrode E2. A second electrode CE may be commonly provided on the plurality of light emitting elements.

The first electrode AE of the light-emitting element LD may be disposed on the eighth insulation layer IL8. The first electrode AE of the light-emitting element LD may be a (semi-) transparent electrode or a reflective electrode. According to an embodiment of the inventive concept, the first electrode AE of the light-emitting element LD may include a reflective layer composed of Ag, Mg, Al, Pt, Pd, Au, Ni, Nd, Jr, Cr, or a compound thereof, and a transparent or semi-transparent electrode layer provided on the reflective layer. The transparent or semi-transparent electrode layer may include indium tin oxide (ITO), indium zinc oxide (IZO), indium gallium zinc oxide (IGZO), zinc oxide (ZnO) or indium oxide ($In_2O_3$), and/or aluminum-doped zinc oxide (AZO). For example, the first electrode AE of the light-emitting element LD may include a laminate structure of ITO/Ag/ITO.

A pixel definition layer PDL may be disposed on the eighth insulation layer IL8. The pixel definition layer PDL may have light absorption property, and have, for example, a block color. The pixel definition layer PDL may include a black coloring agent. The black coloring agent may include a black dye or a black pigment. The black coloring agent may include carbon black, a metal such as chromium, or an oxide thereof. The pixel definition layer PDL may correspond to a light shielding pattern having light shielding property.

The pixel definition layer PDL may cover a portion of the first electrode AE of the light-emitting element LD. For example, an opening PDL-OP exposing a portion of the first electrode AE of the light-emitting element LD may be defined in the pixel definition layer PDL. The pixel definition layer PDL may increase the distance between an edge of the first electrode AE of the light-emitting element LD and the second electrode CE. Accordingly, the pixel definition layer PDL may serve to prevent an arc or the like from occurring at the edge of the first electrode AE.

The first electrode AE and the light emitting layer DP-EL may have a hole control layer disposed therebetween. The hole control layer HCL may include a hole transport layer, and further include a hole injection layer. The light emitting layer DP-EL and the second electrode CE may have an electron control layer disposed therebetween. The electron control layer may include an electron transport layer, and further include an electron injection layer. The hole control layer and the electron control layer may be commonly provided in the plurality of pixels PX (see FIG. 3A) using an open mask.

The encapsulation layer TFE may be disposed on the light-emitting element layer DP-EL. The encapsulation layer TFE may include an inorganic layer TFE1, an organic layer TFE2, and an inorganic layer TFE3 that are sequentially laminated, but the layers defining the encapsulation layer TFE are not necessarily limited thereto.

The inorganic layers TFE1 and TFE3 may protect the light-emitting element layer DP-EL from moisture and oxygen, and the organic layer TFE2 may protect the light-emitting element layer DP-EL from foreign materials such as dust particles. The inorganic layers TFE1 and TFE3 may include a silicon nitride layer, a silicon oxynitride layer, a silicon oxide layer, a titanium oxide layer, an aluminum oxide layer or the like. The organic layer TFE2 may include an acrylic-based organic layer, but is not necessarily limited thereto.

The input sensor IS may be disposed on the display panel DP. The sensor layer IS may be referred to as a sensor, an input sensing layer, or an input sensing panel. The input sensor IS may include a sensor base layer 210, a first conductive layer 220, a sensing insulation layer 230, and a second conductive layer 240.

The sensor base layer 210 may be disposed directly on the display layer DP. The sensor base layer 210 may be an inorganic layer including silicon nitride, silicon oxynitride, and/or silicon oxide. Alternatively, the sensor base layer 210 may be an organic layer including an epoxy resin, an acrylic resin, or an imide-based resin. The sensor base layer 210 may have a single layer structure, or a multilayer structure laminated along the third direction DR3.

Each of the first conductive layer 220 and the second conductive layer 240 may have a single layer structure or a multilayer structure laminated along the third direction DR3. The first conductive layer 220 and the second conductive layer 240 may include conductive lines defining mesh-shaped sensing electrodes. The conductive lines might not overlap the opening PDL-OP, but may overlap the pixel definition layer PDL.

The conductive layer of the single layer structure may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), indium zinc tin oxide (IZTO) or the like. Besides, the transparent conductive layer may include a conductive polymer such as PEDOT, a metal nano-wire, or graphene.

The conductive layer of a multilayer structure may include metal layers that are sequentially laminated. For example, the metal layers may have a three-layer structure of titanium/aluminum/titanium. The conductive layer of the multilayer structure may include at least one metal layer and at least one transparent conductive layer.

A sensing insulation layer 230 may be disposed between the first conductive layer 220 and the second conductive layer 240. The sensing insulation layer 230 may include an inorganic film. The inorganic film may include aluminum oxide, titanium oxide, silicon oxide, silicon nitride, silicon oxynitride, zirconium oxide, and/or hafnium oxide.

Alternatively, the sensing insulation layer 230 may include an organic film. The organic film may include an acrylic-based resin, a methacrylic-based resin, polyisoprene, a vinyl-based resin, an epoxy-based resin, a urethane-based resin, a cellulose-based resin, a siloxane-based resin, a polyimide based-resin, a polyamide-resin, and/or a parylene-based resin.

The anti-reflection layer ARL may be disposed directly on the input sensor IS. The anti-reflection layer ARL may include a division layer 310, a plurality of color filters 320, and a planarization layer 330.

A material defining the division layer 310 is not necessarily limited to any one material as long as it absorbs light. The division layer 310 is a layer having a black color, and, in an embodiment, may include a black coloring agent. The black coloring agent may include a black dye or a black pigment. The black coloring agent may include carbon black, a metal such as chromium, or an oxide thereof.

The division layer 310 may cover the second conductive layer 240 of the input sensor IS. The division layer 310 may prevent reflection of external light caused by the second conductive layer 240. In a section of the display module DM, the division layer 310 may be omitted. A light transmittance of the section in which the division layer 310 is omitted and is not disposed may be higher than that of the other area.

An opening 310-OP may be defined in the division layer 310. The opening 310-OP may overlap the first electrode AE of the light-emitting element LD. Any one of the plurality of color filters 320 may overlap the first electrode AE of the light-emitting element LD. Any one of the plurality of color filters 320 may cover the opening 310-OP. Each of the plurality of color filters 320 may contact the division layer 310.

The planarization layer 330 may cover the division layer 310 and the plurality of color filters 320. The planarization layer 330 may include an organic material, and provide a planar surface on the top surface of the planarization layer 330. In an embodiment of the inventive concept, the planarization layer 330 may be omitted.

Figure 6A:
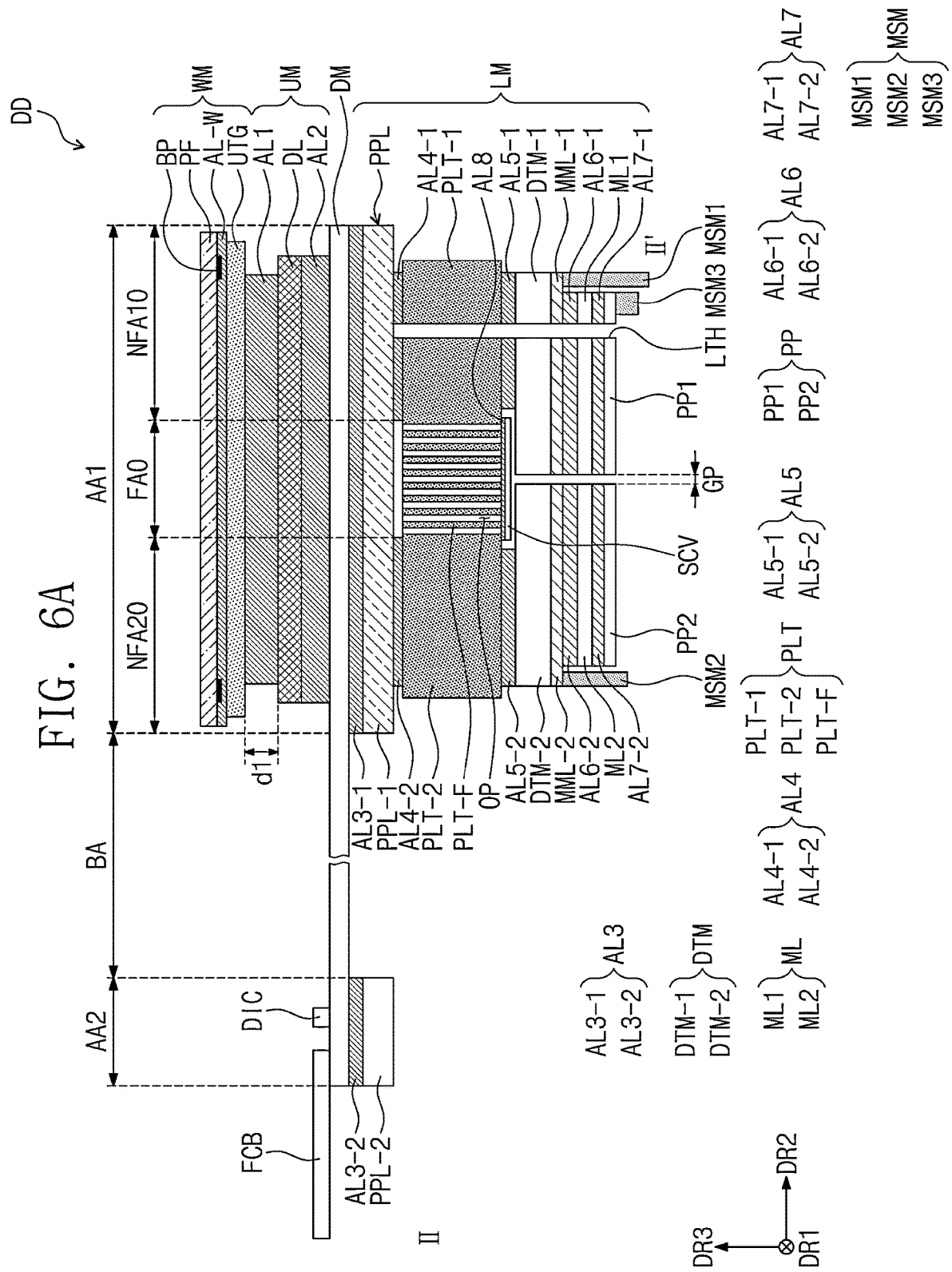
FIGS. 6A and 6B are cross-sectional views of a display device according to an embodiment of the inventive concept.
Figure 6B:
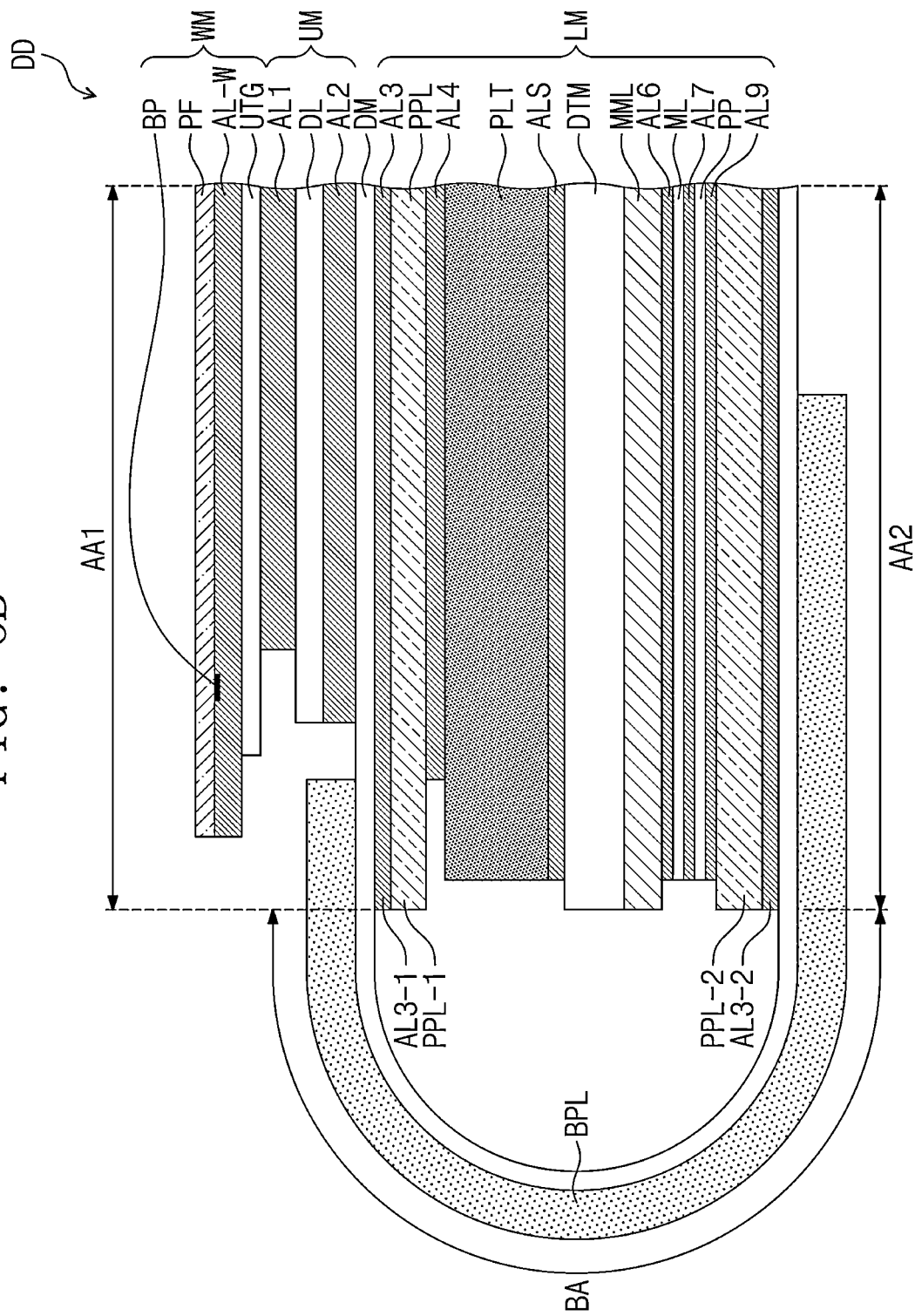

FIGS. 6A and 6B are cross-sectional views of a display device according to an embodiment of the inventive concept.

FIG. 6A illustrates an unfolded state in which the display module DM is not bent. FIG. 6A illustrates a state in which the bending area BA (see FIG. 3A) of the display module DM is bent. In FIGS. 6A and 6B, areas composing the display module DM are shown on the basis of the display panel DP of FIG. 3A.

Referring to FIGS. 6A and 6B, the display device DD includes a window WM, an upper structure UM, the display module DM, and a lower structure LM. Components disposed between the window WM and the display module DM are totally called as the upper structure UM, and components disposed under the display module DM are totally called as the lower structure LM.

The window WM may include a thin-film glass substrate UTG, a window protection layer PF disposed on the thin-film glass substrate UTG, and a bezel pattern BP disposed on the bottom surface of the window protection layer PF. In the embodiment, the window protection layer PF may include a synthetic resin film. The window WM may include a window adhesive layer AL-W bonding the window protection layer PF and the thin-film glass substrate UTG.

The bezel pattern BP overlaps the non-display area NDA shown in FIG. 1A. The bezel pattern BP may be disposed on one surface of the thin-film glass substrate UTG or of the window protection layer PF. FIGS. 6A and 6B illustrate an example bezel pattern BP disposed on the bottom surface of the window protection layer PF. However, the example is not necessarily limited thereto, and the bezel pattern BP may be disposed on the top surface of the window protection layer PF. The bezel pattern BP may be provided as a colored shielding film, for example, in a coating manner. The bezel pattern BP may include a base material, and a dye or pigment mixed with the base material.

The thickness of the thin-film glass substrate UTG may be about 15 μm to about 45 μm. The thickness of the thin-film glass substrate UTG may be, for example, about 30 μm. The thin-film glass substrate UTG may be chemical strengthening glass. The thin-film glass substrate UTG may minimize the generation of a fold, even when folding and unfolding are repeated.

The thickness of the window protection layer PF may be about 50 μm to about 80 μm. The synthetic resin film of the window protection layer PF may include Polyimide, Polycarbonate, Polyamide, Triacetylcellulose, Polymethylmethacrylate, or Polyethylene terephthalate. At least one of a hard core layer, an anti-fingerprint layer, or an anti-reflection layer may be disposed on the top surface of the window protection layer PF.

The window adhesive layer AL-W may be provided with a Pressure Sensitive Adhesive film (PSA), or an Optically Clear Adhesive (OCA). Adhesive layers to be described below may also include the same adhesive as the window adhesive layer AL-W.

The window adhesive layer AL-W may be separated from the thin-film glass substrate UTG. The window protection layer PF has a lower strength than the thin-film glass substrate UTG, and thus may be relatively easily scratched. The window adhesive layer AL-W is separated from the window protection layer PF, and then a new window protection layer PF may be adhered to the thin-film glass substrate UTG. The sum of the thicknesses of the window adhesive layer AL-W and the window protection layer PF may be about 100 μm to about 110 μm. For example, the sum of the thicknesses of the window adhesive layer AL-W and the window protection layer PF may be about 105 μm.

The upper structure UM includes an upper portion film DL. The upper portion film DL may include a synthesis resin film. The synthetic resin film may include Polyimide, Polycarbonate, Polyamide, Triacetylcellulose, Polymethylmethacrylate, or Polyethylene terephthalate.

The upper portion film DL may absorb an external impact applied to the front surface of the display device DD. As shown in FIG. 5, the display module DM according to an embodiment may include an anti-reflection layer structure including the plurality of color filters 320 instead of a polarization film, and thus the front impact strength of the display device DD may be reduced. The upper portion film DL may compensate the impact strength reduced by employing the anti-reflection layer ARL including the color filters 320. In an embodiment of the inventive concept, the upper portion film DL may be omitted.

The upper structure UM may include a first adhesive layer AL1 bonding the upper portion film DL and the window WM and a second adhesive layer AL2 bonding the upper portion film DL and the display module DM. Each of the first adhesive layer AL1 and the second adhesive layer AL2 may be a Pressure Sensitive Adhesive film (PSA), or an Optically Clear Adhesive (OCA). For example, each of the first adhesive layer AL1 and the second adhesive layer AL2 may be the PSA.

In the display device DD of an embodiment, the thickness d1 of the first adhesive layer AL1 may be a prescribed thickness or greater. The thickness d1 of the first adhesive layer AL1 may be, for example, about 75 μm or greater. The thickness d1 of the first adhesive layer AL1 may be, for example, about 75 μm to about 100 μm. For the display device DD of an embodiment, the thickness d1 of the first adhesive layer AL1 bonding the thin-film glass substrate UTG and the upper portion film DL may be as thick as about 75 μm or greater, thereby increasing the mechanical strength of the display device DD. Therefore, the display module DM may be prevented from being damaged by an external impact. When the thickness d1 of the first adhesive layer AL1 exceeds 100 μm, the thickness of the display device DD may excessively increase to lower the folding characteristics or the like of the display device DD.

The sum of the thicknesses of the upper portion film DL and the second adhesive layer AL2 may be about 60 μm to about 80 μm. The sum of the thicknesses of the upper portion film DL and the second adhesive layer AL2 may be, for example, about 73 μm.

The lower structure LM may include a lower portion protection film PPL, a first support layer PLT, a cover layer SCV, a digitizer DTM, an electromagnetic shielding layer MML, a metal layer ML, a second support layer PP, and third to ninth adhesive layers AL3 to AL9. The third to ninth adhesive layers AL3 to AL9 may include an adhesive such as a PSA or an OCA. In an embodiment of the inventive concept, some of the foregoing components may be omitted.

The lower portion protection film PPL may be disposed under the display module DM. The lower portion protection film PPL may protect a lower portion of the display panel DM. The lower portion protection film PPL may include a flexible synthesis resin film. For example, the lower portion protection film PPL may include polyethylene terephthalate.

In an embodiment of the inventive concept, the lower portion protection film PPL might not be disposed in the bending area BA. The lower portion protection film PPL may include a first lower portion protection film PPL-1 protecting the first area AA1 of the display panel DP (see FIG. 3A), and a second lower portion protection film PPL-2 protecting the second area AA2.

A third adhesive layer AL3 bonds the lower portion protection film PPL and the display panel DP. The third adhesive layer AL3 may include a first portion AL3-1 corresponding to the first lower portion protection film PPL-1 and a second portion AL3-2 corresponding to the second lower portion protection film PPL-2.

The sum of the thicknesses of the display module DM, the third adhesive layer AL3, and the lower portion protection film PPL may be about 90 μm to about 120 μm. For example, the sum of the thicknesses of the display module DM, the third adhesive layer AL3, and the lower portion protection film PPL may be about 105 μm.

The lower portion protection film PPL may be disposed under the base layer BL of the display panel DP in FIGS. 4 and 5. In an embodiment, the third adhesive layer AL3 is disposed directly under the base layer BL of the display panel DP, and the lower portion protection film PPL may be disposed directly under the third adhesive layer AL3.

As shown in FIG. 6B, when the bending area BA is bent, the second lower portion protection film PPL-2 may be disposed under the first area AA1 and the first lower portion protection film PPL-1 together with the second area AA2. Since the lower portion protection film PPL is not disposed in the bending area BA, the bending area BA may be more easily bent. The second lower portion protection film PPL-2 may be attached to the second support layer PP through the ninth adhesive layer AL9. The ninth adhesive layer AL9 may be omitted.

As shown in FIG. 6B, the bending area BA has a prescribed curvature and radius of curvature. The radius of curvature may be about 0.1 mm to 0.5 mm. The bending protection layer BPL may be disposed at least in the bending area BA. The bending protection layer BPL may overlap the bending area BA, the first area AA1, and the second area AA2. The bending protection layer BPL may be disposed on a portion of the first area AA1, and a portion of the second area AA2.

The bending protection layer BPL may be bent together with the bending area BA. The bending protection layer BPL protects the bending area BA from an external impact, and controls the neutral surface of the bending area BA. The bending protection layer BPL controls the stress of the bending area BA so that the neutral surface is close to the signal lines disposed in the bending area BA.

As shown in FIGS. 6A and 6B, the fourth adhesive layer AL4 bonds the lower portion protection film PPL and the support layer PLT. The fourth adhesive layer AL4 in the specification may be referred to as a first additional adhesive layer. The thickness d1 of the fourth adhesive layer AL4 may be about 10 μm to about 20 μm. For example, the thickness of the fourth adhesive layer AL4 may be about 16 μm.

The fourth adhesive layer AL4 may include a first portion AL4-1 and a second portion AL4-2 that are separated from each other. The distance (or interval) between the first portion AL4-1 and the second portion AL4-2 corresponds to the width of the folding area FAO, and is greater than a gap GP to be described below. The separation distance between the first portion AL4-1 and the second portion AL4-2 may be about 7 mm to about 15 mm, preferably, about 9 mm to about 13 mm.

In the embodiment, the first portion AL4-1 and the second portion AL4-2 are defined as different portions of one adhesive layer, but are not necessarily limited thereto. When the first portion AL4-1 is defined as one adhesive layer (e.g., the first adhesive layer or second adhesive layer), the second portion AL4-2 may be defined as another adhesive layer (e.g., the second adhesive layer or third adhesive layer). The above-described definitions may be applied to all the adhesive layers including two portions of adhesive layers to be described below as well as the fourth adhesive layer AL4.

The fourth adhesive layer AL4 is disposed directly under the lower portion protection film PPL, and the first support layer PLT is disposed directly under the fourth adhesive layer AL4. In the display device DD of an embodiment, the first support layer PLT is directly attached under the lower portion protection film PPL via the fourth adhesive layer AL4, and another component might not be interposed therebetween. The display device DD of an embodiment might not include another component except for the fourth adhesive layer AL4 of one layer between the first support layer PLT and the lower portion protection film PPL disposed under the display module DM, and thus a reaction force to the folding operation may be reduced. When a barrier film such as a polymer film is not disposed between the lower portion protection film PPL and the first support layer PLT, the entire mechanical strength of the display device DD may be reduced. However, the display device DD of an embodiment uses the aforementioned first adhesive layer AL1 with a thickness of about 75 μm or greater, and thus a sufficient mechanical strength may be secured even when the barrier film is omitted.

Figure 7:
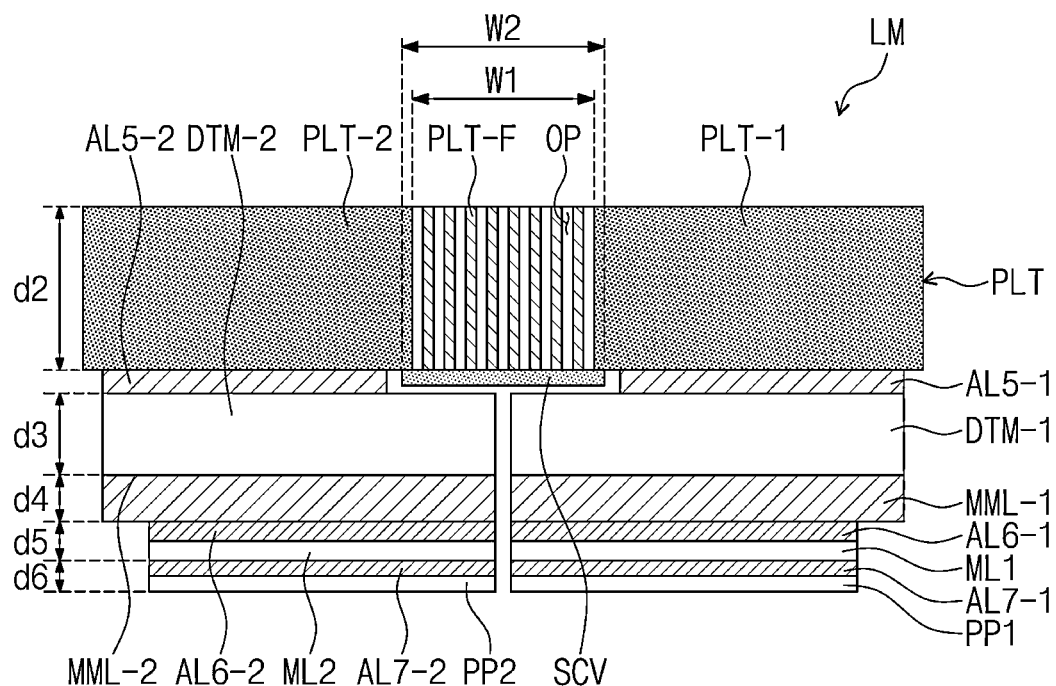
FIG. 7 is a cross-sectional view of a lower structure according to an embodiment of the inventive concept.
Figure 7:
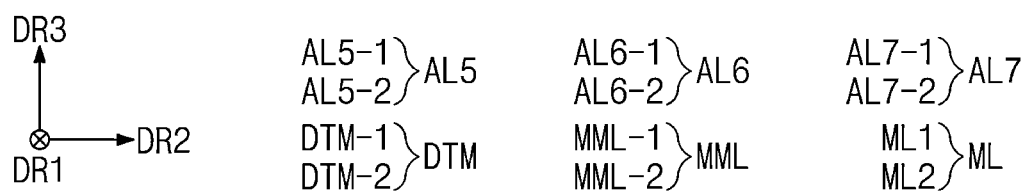

FIG. 7 is a cross-sectional view of the lower structure according to an embodiment of the inventive concept. FIG. 7 illustrates the digitizer DTM, the electromagnetic shielding layer MML, the metal layer ML, the second support layer PP, and the fifth to seventh adhesive layers AL5 to AL7 among the lower structure shown in FIGS. 6A and 6B, and the lower portion protection film PPL, the third adhesive layer AL3, the fourth adhesive layer AL4, the eighth adhesive layer ALB, and the magnetic field shielding sheet MSM are omitted.

Referring to FIGS. 6A, 6B, and 7 together, the first support layer PLT is disposed under the lower portion protection film PPL. The support layer PLT supports components disposed thereabove, and maintains an unfolded state and a folded state of the display device DD. The first support layer PLT may have the strength that is greater than the lower portion protection film PPL. The support layer PLT may include at least a first support portion PLT-1 corresponding to the first non-folding area NFA10, and a second support portion PLT-2 corresponding to the second non-folding area NFA20. The first support portion PLT-1 and the second support portion PLT-2 are spaced apart from each other in the second direction DR2.

Like the embodiment, the first support layer PLT may include a folding portion PLT-F corresponding to the folding area FAO, disposed between the first support portion PLT-1 and the second support portion PLT-2, and defined with a plurality of openings OP. The plurality of openings OP may be arranged so that the folding area FAO has a lattice shape in a plan view. The first support portion PLT-1, the second support portion PLT-2, and the folding portion PLT-F may have an integrated shape, e.g., they may be formed of a singular uninterrupted structure.

During the folding operation shown in FIGS. 1B and 1C, the folding portion PLT-F may prevent a foreign matter from being permeated from the first support portion PLT-1 and the second support portion PLT-2 to a lower portion of an opened central area of the lower portion protection film PPL. The flexibility of the folding portion PLT-F is increased by the plurality of openings OP. In addition, the fourth adhesive layer AL4 is not disposed in the folding portion PLT-F, and thus the flexibility of the first support layer PLT may be enhanced. The folding portion PLT-F may be omitted in an embodiment of the inventive concept. In this case, the first support layer PLT may include the first support portion PLT-1 and the second support portion PLT-2 that are spaced apart from each other.

The first support layer PLT may be selected from a material that may transmit an electromagnetic field generated by the digitizer DTM without a loss or with a minimum loss. The first support layer PLT may include a material having the insulation property. The first support layer PLT may include a non-metal material. The first support layer PLT may include a fiber-reinforced composite. The first support layer PLT may include a reinforced fiber disposed inside a matrix. The reinforced fiber may be a carbon fiber, or glass fiber. The matrix may include a polymer resin. The matrix may include a thermoplastic resin. For example, the matrix may include a polyamide-based resin or a polypropylene-based resin. For example, the fiber-reinforced composite may be a carbon fiber-reinforced plastic (CFRP) or a glass fiber-reinforced plastic (GFRP).

The thickness d2 of the first support layer PLT may be about 150 μm to about 200 μm. For example, the thickness d2 of the first support layer PLT may be about 170 μm.

The first support layer PLT may have the cover layer SCV and the digitizer DTM disposed thereunder. The cover layer SCV overlaps the folding area FAO. The digitizer DTM may include a first digitizer DTM-1 and a second digitizer DTM-2 respectively overlapping the first support portion PLT-1 and the second support portion PLT-2. A portion of each of the first digitizer DTM-1 and the second digitizer DTM-2 may be disposed under the cover layer SCV.

The fifth adhesive layer AL5 bonds the first support layer PLT and the digitizer DTM, and the eighth adhesive layer AL8 bonds the cover layer SCV and the first support layer PLT. The fifth adhesive layer AL5 may include a first portion AL5-1 bonding the first support portion PLT-1 and the first digitizer DTM-1, and a second portion AL5-2 bonding the second support portion PLT-2 and the second digitizer DTM-2. The fifth adhesive layer AL5 in the specification may be referred to as a second additional adhesive layer.

The cover layer SCV may be disposed between the first portion AL5-1 and the second portion AL5-2 in the second direction DR2. The cover layer SCV may be spaced apart from the digitizer DTM so as to prevent interference to the digitizer DTM in an unfolded state. The sum of the thicknesses of the cover layer SCV and the eighth adhesive layer AL8 may be smaller than the thickness of the fifth adhesive layer AL5. The sum of the thicknesses of the cover layer SCV and the eighth adhesive layer AL8 may be about 10 μm to about 20 μm. For example, the sum of the thickness of the cover layer SCV and the eighth adhesive layer AL8 may be about 16 μm. The thickness of the fifth adhesive layer AL5 may be about 15 μm to about 25 μm. For example, the thickness of the fifth adhesive layer AL5 may be about 20 μm.

The cover layer SCV may be manufactured as a sheet to be attached to the first support layer PLT. The cover layer SCV may be attached under a portion corresponding to the folding portion PLT-F of the first support layer PLT. The cover layer SCV may be attached under the folding portion PLT-F to block moisture or foreign materials from entering the plurality of openings OP defined in the folding portion PLT-F. The cover layer SCV may include a material having a low modulus of elasticity, for example, thermoplastic polyurethane The cover layer SCV may be attached under the folding portion PLT-F of the first support layer PLT, and not be attached under most of the first support portion PLT-1 and the second support portion PLT-2.

The width in one direction of the cover layer SCV may be greater than that in the one direction of the folding portion PLT-F. In an embodiment, on the basis of the second direction DR2 in which the first support portion PLT-1, the folding portion PLT-F, and the second support portion PLT-2 are arranged, the folding portion PLT-F may have a first width W1 and the cover layer SCV may have a second width W2. The first width W1 may be smaller than the second width W2. The first width W1 may be as small as about 0.5 mm to about 3 mm in comparison to the second width W2. In an embodiment, the first width W1 may be about 6 mm to about 10 mm. For example, the first width W1 may be about 8.65 mm. In an embodiment, the second width W2 may be about 9 mm to about 15 mm. For example, the second width W2 may about 10.65 mm.

The digitizer DTM is called as an EMR sensing panel, and includes a plurality of loop coils configured to generate a magnetic field of a resonance frequency preset with an electronic pen. The magnetic field provided by the loop coils is applied to an LC resonance circuit configured from an inductor (a coil) and a capacitor of the electronic pen. The coil generates a current by means of the received magnetic field and delivers the generated current to the capacitor. Accordingly, the capacitor is charged with the current input from the coil, and the charged current is discharged to the coil. Finally, a magnetic field of the resonance frequency is emitted to the coil. The magnetic field emitted by the electronic pen may be absorbed again by the loop coils of the digitizer, and accordingly, it may be determined that the electronic pen is located at which position on the touch screen.

The digitizer DTM may include the first digitizer DTM-1 and a second digitizer DTM-2. The first digitizer DTM-1 and the second digitizer DTM-2 are spaced apart from each other with a prescribed gap GP interposed therebetween. The gap GP may be about 0.3 mm to 3 mm and may correspond to the folding area FAO.

The thickness d3 of the digitizer DTM may be about 120 μm to about 180 μm. The thickness d3 of the digitizer DTM may be about 140 μm to about 160 μm. The thickness d3 of the digitizer DTM may be, for example, about 152 μm. As the thickness d3 of the digitizer DTM meets the foregoing range, the lower structure LM including the digitizer DTM may be robust to an external impact and prevent the display device DD from being excessively thick.

The electromagnetic shielding layer MML is disposed under the digitizer DTM. The electromagnetic shielding layer MML may be disposed directly under the digitizer DTM. The electromagnetic shielding layer MML may perform an electromagnetic shielding function. As the electromagnetic shielding layer MML performs the electromagnetic shielding function, it may be minimized that electromagnetic waves, generated from the electronic module EM (see FIG. 2A), the electronic optical module ELM (see FIG. 2A), and the power supply module PSM (see FIG. 2A) disposed in the lower portion, influence the digitizer DTM and the display panel DP. In addition, as the electromagnetic shielding layer MML is disposed, the sensitivity of the digitizer DTM is enhanced, and a signal to be applied to the digitizer DTM becomes uniform to increase the reliability of the display device DD.

The electromagnetic shielding layer MML may include magnetic metal powder (MMP). The electromagnetic shielding layer MML may include the magnetic metal powder to perform the electromagnetic shielding function. The magnetic metal powder included in the electromagnetic shielding layer MML may include a soft magnetic powder alloy. The electromagnetic shielding layer MML may include, for example, iron (Fe), silicon (Si), and aluminum (Al). The electromagnetic shielding layer MML may include the iron of 85 at %, the silicon of 9 at %, and the aluminum of 6 at %.

The electromagnetic shielding layer MML may include a first electromagnetic shielding layer MML-1 and a second electromagnetic shielding layer MML-2. The first electromagnetic shielding layer MML-1 may be disposed under the first digitizer DTM-1 and the second electromagnetic shielding layer MML-2 may be disposed under the second digitizer DTM-2. The first electromagnetic shielding layer MML-1 may be disposed directly under the first digitizer DTM-1 and the second electromagnetic shielding layer MML-2 may be disposed directly under the second digitizer DTM-2.

The thickness d4 of the electromagnetic shielding layer MML may be about 30 μm to about 60 μm. The thickness d4 of the electromagnetic shielding layer MML may be, for example, about 45 μm to about 55 μm. The thickness d4 of the electromagnetic shielding layer MML may be about 50 μm. When the thickness d4 of the electromagnetic shielding layer MML is smaller than about 30 μm, the shielding performance of the electromagnetic shielding layer MML may be reduced. When the thickness d4 of the electromagnetic shielding layer MML is greater than about 60 μm, the thickness of the display device DD may become excessively thick.

A metal layer ML is disposed under the electromagnetic shielding layer MML. The metal layer ML may include a first metal layer ML1 and a second metal layer ML2 respectively overlapping the first support portion PLT-1 and the second support portion PLT-2. The metal layer ML may dissipate heat generated during driving the digitizer DTM to the outside. The metal layer ML transfers the heat generated in the digitizer DTM to the lower side. The metal layer ML may have a higher electrical conductivity and thermal conductivity than a metal plate to be described below. The metal ML may include copper or aluminum. The metal layer ML having a relatively higher electrical conductivity may prevent that electromagnetic waves generated from the electronic module EM (see FIG. 2A), the electronic optical module ELM (see FIG. 2A) the power supply module PSM (see FIG. 2A) and the like disposed in the lower side influence the digitizer DTM as noises. The lower structure LM in an embodiment includes the electromagnetic shielding layer MML and the metal layer ML disposed under the digitizer DTM, and thus the performance of the digitizer DTM may be prevented from being degraded by electronic parts such as the electronic module included in the electronic device.

The sixth adhesive layer AL6 bonds the electromagnetic shielding layer MML and the metal layer ML. The sixth adhesive layer AL6 may a first portion AL6-1 and a second portion AL6-2 respectively corresponding to the first metal layer ML1 and the second metal layer ML2. The sixth adhesive layer AL6 in the specification may be referred to as a third additional adhesive layer.

The sum of the thicknesses of the metal layer ML and the sixth adhesive layer AL6 may be about 15 µm to about 25 µm. For example, the sum of the thicknesses of the metal layer ML and the sixth adhesive layer AL6 may be about 20 µm.

The second support layer PP is disposed under the metal layer ML. The second support layer PP may include a 2-1st support layer PP1 and a 2-2nd support layer PP2 respectively overlapping the first metal layer ML1 and the second metal layer ML2. The second support layer PP may absorb an external impact applied from the lower side.

The second support layer PP may have the insulation property. The second support layer PP may include an insulation material. In an embodiment, the second support layer PP may include, for example, a polymer film. The support layer PP may include Polyimide, Polycarbonate, Polyamide, Triacetylcellulose, Polymethylmethacrylate, or Polyethylene terephthalate. For example, the second support layer PP may include polyethylene terephthalate.

The seventh adhesive layer AL7 may bond the metal layer ML and the second support layer PP. The seventh adhesive layer AL7 may include a first portion AL7-1 and a second portion AL7-2 respectively corresponding to the 2-1st support layer PP1 and the 2-2nd support layer PP2. The seventh adhesive layer AL7 in the specification may be referred to as a lower portion adhesive layer.

The sum d6 of the thicknesses of the second support layer PP and the seventh adhesive layer AL7 may be about 1 µm to about 10 µm. The sum of the thicknesses of the second support layer PP and the seventh adhesive layer AL7 may be about 2 µm to about 8 µm. The sum of the thicknesses of the second support layer PP and the seventh adhesive layer AL7 may be about 6 µm. The thickness of the second support layer PP may be about 3 µm. When the sum of the thicknesses of the second support layer PP and the seventh adhesive layer AL7 is smaller than 1 inn, the impact absorption characteristics of the second support layer PP may be degraded, and when the sum of the thicknesses of the second support layer PP and the seventh adhesive layer AL7 is greater than 10 µm, the entire thickness of the display device DD may increase.

The bottom surface of at least a portion of the second support layer PP may define the lowest surface of the lower structure LM. The bottom surface of at least a portion of the second support layer PP may define the lowest surface of the display device DD. In the display device DD of an embodiment, another component might not be disposed on the bottom surface of at least a portion of the second support layer PP. On the bottom surface of the second support layer PP, another surface excluding a partial surface on which the magnetic field shielding sheet MSM is disposed may define the lowest surface of the lower structure LM. In the display device DD of an embodiment, the magnetic field shielding sheet MSM may be disposed under a portion of the second support layer PP, and the other portion excluding the portion that includes the magnetic field shielding sheet MSM may be provided as an exposed surface without a functional layer such as a heat dissipation layer.

In the display device DD of an embodiment, the second support layer PP disposed under the metal layer ML is provided with an insulation material, namely, a polymer film including a polymer material such as polyethylene terephthalate, and the second support layer PP may have a thin thickness of 10 µm or smaller. Accordingly, in comparison to a typical display device including a metal plate including a metal material such as stainless steel under the metal layer, the entire thickness and weight of the display device DD may be reduced to enable the display device DD to be thin and lightweight. In addition, a process for attaching a metal plate may be replaced with a relatively simple polymer film attaching process to simplify the process and reduce a process cost.

When the second support layer PP including an insulation material rather than the typical metal plate is provided, the entire mechanical strength of the display device DD may be reduced. However, in an embodiment of the inventive concept, the thickness d3 of the digitizer DTM is as thick as about 120 µm or greater, and thus a sufficient mechanical strength may be secured even when the metal plate is omitted and the second support layer PP is included.

The magnetic field shielding sheet MSM is disposed under the second support layer PP. The magnetic field shielding sheet MSM blocks magnetic fields generated in the electronic parts disposed in a lower side. The magnetic field shielding sheet MSM may prevent the magnetic fields generated in the electronic parts from interfering with the digitizer DTM. The electronic parts may include the electronic module EM, the electronic optical module ELM, and the power supply module PSM mentioned above with reference to FIGS. 2A and 2B.

The magnetic field shielding sheet MSM includes a plurality of portions. At least some of the plurality of portions may have different thicknesses. The plurality of portions may correspond to an offset of a bracket disposed under the display device DD. The magnetic field shielding sheet MSM may have a structure in which the magnetic shielding layers and the adhesive layers are alternately laminated. A portion of the magnetic field shielding sheet MSM is directly attached under the second support layer PP, and another portion of the magnetic field shielding sheet MSM may be directly attached under the electromagnetic shielding layer MML. The disposition of the magnetic field shielding sheet MSM will be described in detail with reference to FIG. 8D.

A through hole LTH may be provided in some elements of the lower structure LM. The through hole LTH may overlap the sensing area DP-TA in FIG. 2A. As shown in FIG. 6A, the through hole LTH may penetrate from the fifth adhesive layer AL5 to the second support layer PP. The through hole LTH may provide the path of an optical signal with a light shielding structure removed therefrom, and thus may increase an optical signal reception efficiency of the electronic optical module ELM.

Figure 8A:
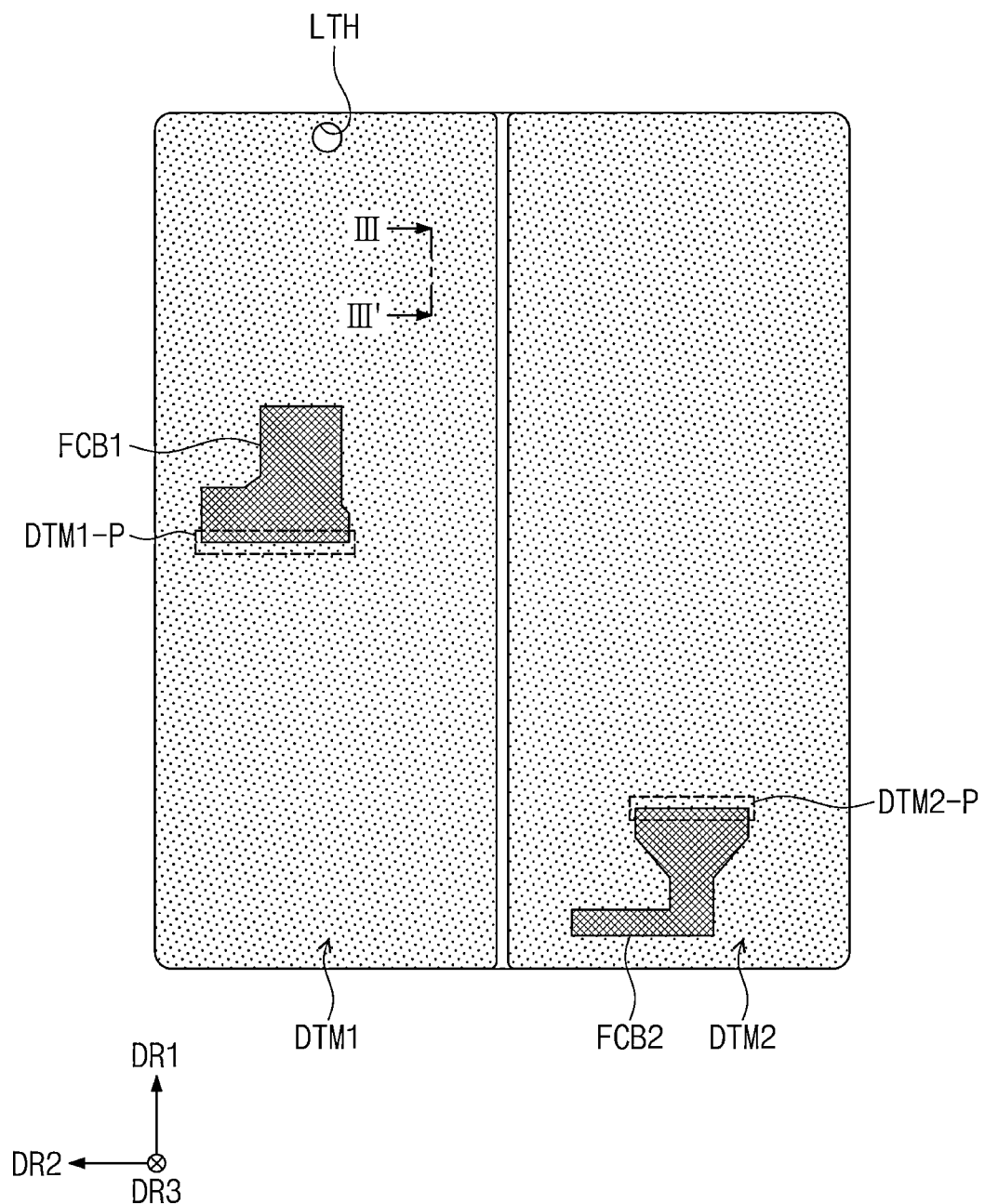
FIG. 8A is a plan view of a digitizer according to an embodiment of the inventive concept.
Figure 8B:
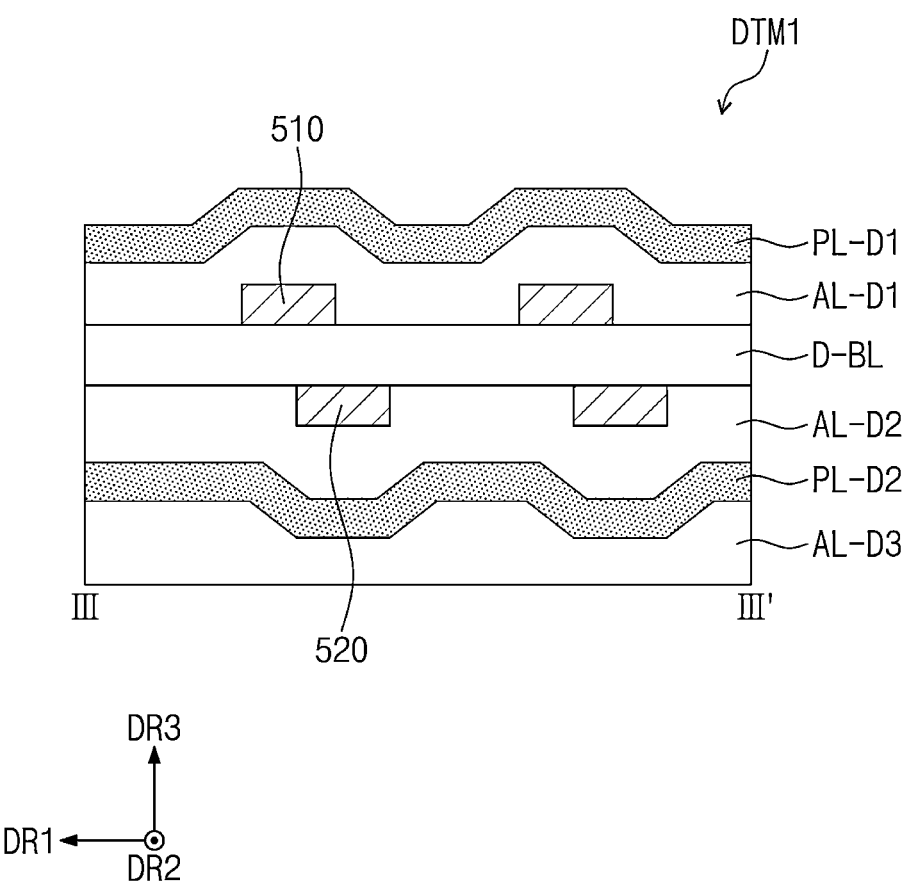
FIG. 8B is a cross-sectional view of a digitizer according to an embodiment of the inventive concept.
Figure 8C:
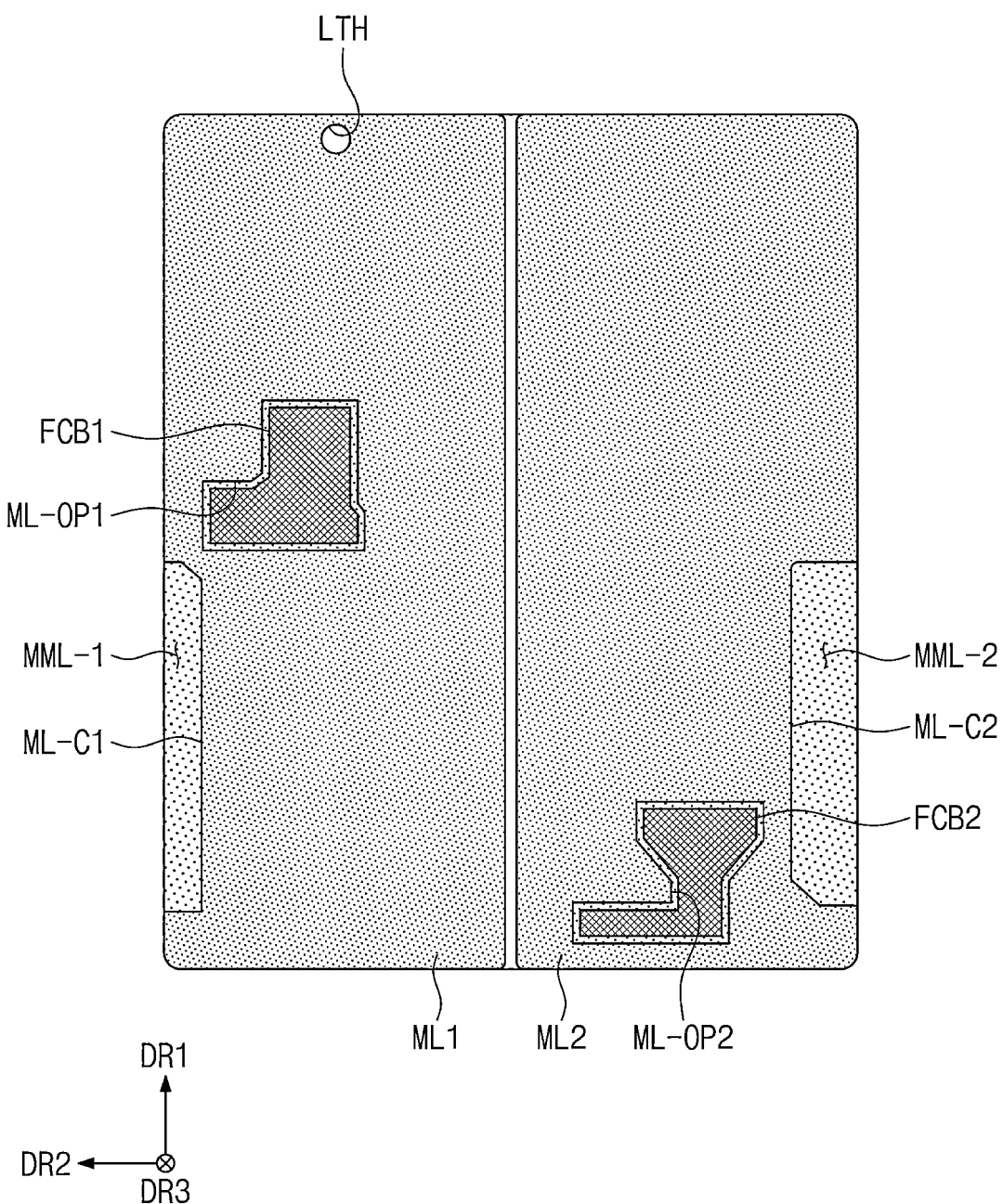
FIGS. 8C and 8D are plan views showing partial configurations of a lower structure according to an embodiment of the inventive concept.
Figure 8D:
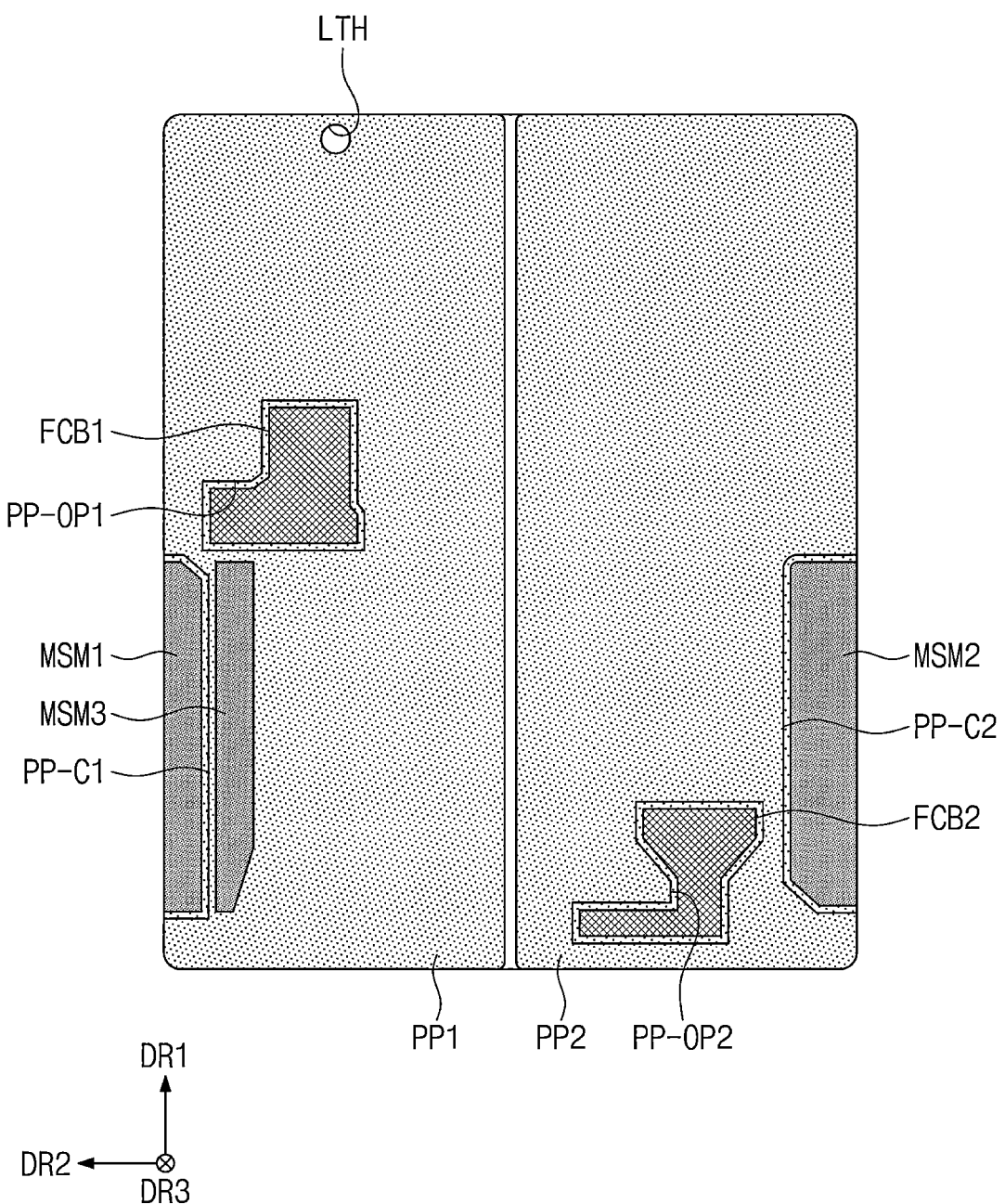

FIG. 8A is a plan view of a digitizer according to an embodiment of the inventive concept. FIG. 8B is a cross-sectional view of a digitizer according to an embodiment of the inventive concept. FIGS. 8C and 8D are plan views showing some components of the lower structure according to an embodiment of the inventive concept. FIGS. 8A, 8C, and 8D are shown on the basis of a state in which the display device DD shown in FIG. 6A is turned left-to-right.

As shown in FIG. 8A, the digitizer DTM may include the first digitizer DTM-1 and the second digitizer DTM-2 spaced apart from each other. The first digitizer DTM-1 and the second digitizer DTM-2 may be electrically connected to a first flexible circuit board FCB1 and a second flexible circuit board FCB2. The first digitizer FCB1 and a second digitizer FCB2 may electrically connect the first flexible circuit board DTM-1 and the second flexible circuit board DTM-2 to the main circuit board.

The first digitizer DTM-1 and the second digitizer DTM-2 may respectively include a plurality of first loop coils and a plurality of second loop coils. The first loop coils may be referred to as driving coils, and the second loop coils may be referred to as sensing coils. The plurality of first loop coils and the plurality of second loop coils may be disposed on different layers from each other.

Referring to FIG. 8B, a laminate structure of the digitizer DTM will be described with reference to a cross section of the first digitizer DTM-1. FIG. 8B illustrates the cross-section of the first digitizer DTM-1 disposed in the same state as the display device DD shown in FIG. 6A. The first digitizer DTM-1 and the second digitizer DTM-2 may have the same laminate structure.

The digitizer DTM-1 includes a base layer D-BL, the first loop coils 510 disposed on one surface of the base layer D-BL, and the second loop coils 520 disposed on the other surface of the base layer D-BL. The base layer D-BL may include a synthetic resin film. The base layer D-BL may include, for example, a polyimide film. Alternatively, the base layer D-BL may include an epoxy resin film. The first loop coils 510 and the second loop coils 520 may include a metal such as gold (Au), silver (Ag), copper (Cu), aluminum (Al) or the like.

Protection layers protecting the first loop coils 510 and the second loop coils 520 may be disposed on the one surface and the other surface of the base layer D-BL. A first protection layer PL-D1 may be disposed on the first loop coils 510 and be adhered to the one surface of the base layer D-BL through a first adhesive layer AL-D1. A second protection layer PL-D2 may be disposed on the second loop coils 520 and be adhered to the other surface of the base layer D-BL through a second adhesive layer AL-D2. The protection layers may include a synthetic rein film, for example, a polyimide film. A third adhesive layer AL-D3 may be disposed under the second protection layer PL-D2, which results in that the aforementioned electromagnetic shielding layer MML in FIG. 6A is attached under the first digitizer DTM-1.

As described above, since the first support layer PLT has the insulation property, electromagnetic fields generated from the first loop coils 510 and the second loop coils 520 may pass through the first support layer PLT. The digitizer DTM disposed under the first support layer PLT may sense an external input.

Referring to FIG. 8A again, an opening corresponding to the through hole LTH in FIG. 8A may be defined in the first digitizer DTM-1. The first flexible circuit board FCB1 may be bonded to a pad area DTM1-P of the first digitizer DTM-1, and the second flexible circuit board FCB2 may be bonded to a pad area DTM2-P of the second digitizer DTM-1. The flexible circuit boards FCB1 and FCB2 and the pad areas DTM1-P and DTM2-P corresponding to each other through an anisotropic conductive adhesive layer may be electrically bonded.

The pad area DTM1-P of the first digitizer DTM-1 may be defined as an area in which terminals of the first loop coils and the second loop coils are aligned, or an area in which terminals of signal lines electrically connected to the first loop coils and the second loop coils are aligned. The pad area DTM2-P of the second digitizer DTM-2 may also be defined as an area in which the terminals of the first loop coils and the second loop coils are aligned, or an area in which the terminals of signal lines electrically connected to the first loop coils and the second loop coils are aligned.

Referring to FIG. 8C, the first metal layer ML1 is disposed on the first electromagnetic shielding layer MML-1, and the second metal layer ML2 is disposed on the second electromagnetic shielding layer MML-2. An opening ML-OP1 exposing the first flexible circuit board FCB1 is defined in the first metal layer ML1. The opening ML-OP1 corresponds to a passage for connecting the first flexible circuit board FCB1 to the main circuit board. An opening ML-OP2 exposing the second flexible circuit board FCB2 is defined in the second metal layer ML2. Openings may also be defined in the electromagnetic shielding layers MML-1 and MML-2 so as to overlap the openings ML-OP1 and ML-OP2 defined in the first metal layer ML1 and the second metal layer ML2, respectively. Cutting parts ML-C1 and ML-C2 may be respectively defined in the first metal layer ML1 and the second metal layer ML2. A portion of the electromagnetic shielding layers MML-1 and MML-2 may be exposed by the cutting parts ML-C1 and ML-C2.

As shown in FIGS. 8C and 8D, the 2-1st support layer PP1 is disposed on the first metal layer ML1, and the 2-2nd support layer PP2 is disposed on the second metal layer ML2. An opening PP-OP1 corresponding to the opening ML-OP1 of the first metal layer ML1 may be defined in the 2-1st support layer PP1. An opening PP-OP2 corresponding to the opening ML-OP2 of the second metal layer ML2 may be defined in the 2-2nd support layer PP2. A cutting part PP-C1 corresponding to the cutting part ML-C1 of the first metal layer ML1 may be defined in the 2-1st support layer PP1. A cutting part PP-C2 corresponding to the cutting part ML-C2 of the second metal layer ML2 may be defined in the 2-2nd support layer PP2. An opening corresponding to the through hole LTH may be defined in the 2-1st support layer.

As shown in FIG. 8D, a first magnetic field shielding sheet MSM1 is disposed in the cutting part ML-C1 of the first metal layer ML1, and a second magnetic field shielding sheet MSM2 is disposed in the cutting part ML-C2 of the second metal layer ML2. The first magnetic field shielding sheet MSM1 is attached to the first electromagnetic shielding layer MML-1, and the first magnetic field shielding sheet MSM2 is attached to the second electromagnetic shielding layer MML-2. Referring to FIG. 8D, a third magnetic field shielding sheet MSM3 may be attached onto the 2-1st support layer PP1. The third magnetic field shielding sheet MSM3 may be disposed adjacent to the first magnetic field shielding sheet MSM1.

Referring to FIGS. 6A and 8D, the magnetic field shielding sheet MSM includes the first magnetic field shielding sheet MSM1 attached under the first electromagnetic shielding layer MML-1, the second magnetic field shielding sheet MSM2 attached under the second electromagnetic shielding layer MML-2, and the third magnetic field shielding sheet MSM3 attached under the 2-1st support layer PP1, and each of the first magnetic field shielding sheet MSM1, the second magnetic field shielding sheet MSM2, and the third magnetic field shielding sheet MSM3 overlaps the non-folding areas NFA10 and NFA20 of the display device DD. The magnetic field shielding sheet MSM included in the display device DD does not overlap the folding area FAO.

In the display device DD of an embodiment, since the magnetic field shielding sheet MSM overlaps the folding area FAO is omitted, a reaction force in response to the folding operation may be reduced. In the display device DD of an embodiment, even when the magnetic field shielding sheet MSM overlapping the folding area FAO is omitted, the electromagnetic shielding layer MML has the thickness of 30 µm or greater and thus sufficient electromagnetic wave shielding performance may also be secured in a folding area portion through the thick electromagnetic shielding layer MML. Accordingly, it is possible to prevent performance degradation of the digitizer DTM.

According to an embodiment of the inventive concept, the barrier film in the lower portion of the display panel and the electromagnetic shielding sheet overlapping the folding area may be omitted, which results in better folding characteristics. In addition, even when a heavy and thick metal plate included in the lower structure of the display device is omitted, the mechanical strength of the display device may be sufficiently secured and thus the display device may be made to be thin and lightweight.

While embodiments of the invention have been described herein with reference to exemplary embodiments thereof, it will be clear to those of ordinary skill in the art to which the invention pertains that various changes and modifications may be made to the described embodiments without departing from the spirit and technical area of the invention.

What is claimed is:

1. A display device, comprising:
   a display panel comprising a first non-folding area, a second non-folding area, and a folding area disposed between the first non-folding are and the second non-folding area;
   a window disposed on the display panel;
   a first adhesive layer disposed between the window and the display panel, and having a first thickness; and
   a lower structure disposed under the display panel,
   wherein the lower structure comprises:
      a first support layer overlapping the first non-folding area and the second-non-folding area;
      a digitizer disposed under the first support layer, comprising a loop coil, and overlapping the first non-folding area and the second non-folding area;
      an electromagnetic shielding layer disposed under the digitizer and having a second thickness;
      a metal layer disposed under the electromagnetic shielding layer; and
      an insulating second support layer disposed under the metal layer,
   wherein the first thickness is about 75 µm to about 100 µm, and the second thickness is about 30 µm to about 60 µm, and
   wherein at least a portion of a bottom surface of the second support layer is a lowest surface of the lower structure.

2. The display device of claim 1, wherein the lower structure further comprises:
   a lower portion protection film disposed under the display panel; and
   a first additional adhesive layer disposed between the lower portion protection film and the first support layer,
   wherein the first additional adhesive layer is disposed directly under the lower portion protection film, and the first support layer is disposed directly under the first additional adhesive layer.

3. The display device of claim 1, wherein the second support layer comprises polyethylene terephthalate (PET).

4. The display device of claim 1, wherein the first support layer comprises a fiber-reinforced composite.

5. The display device of claim 1, wherein the lower structure further comprises a magnetic field shielding sheet disposed under at least a portion of the second support layer and the electromagnetic shielding layer.

6. The display device of claim 1, further comprising:
   an upper portion film disposed between the display panel and the first adhesive layer,
   wherein the upper portion film is disposed directly under the first adhesive layer.

7. The display device of claim 1, wherein the window comprises:
   a thin-film glass substrate disposed on the first adhesive layer; and
   a window protection layer disposed on the thin-film glass substrate.

8. The display device of claim 1, wherein the digitizer comprises:
   a first digitizer overlapping the first non-folding area; and
   a second digitizer overlapping the second non-folding area.

9. The display device of claim 8, wherein the lower structure further comprises a second additional adhesive layer disposed between the digitizer and the first support layer.

10. The display device of claim 8, wherein the electromagnetic shielding layer comprises:
    a first electromagnetic shielding layer disposed under the first digitizer; and
    a second electromagnetic shielding layer disposed under the second digitizer.

11. The display device of claim 8, wherein the metal layer comprises:
    a first metal layer disposed under the first digitizer; and
    a second metal layer disposed under the second digitizer,
    wherein the second support layer comprises:
    a 2-1st support layer disposed under the first metal layer; and
    a 2-2nd support layer disposed under the second metal layer.

12. The display device of claim 1, wherein the lower structure further comprises a lower portion adhesive layer disposed between the metal layer and the second support layer,
    wherein the lower portion adhesive layer is disposed directly under the metal layer, and
    wherein the second support layer is disposed directly under the lower portion adhesive layer.

13. The display device of claim 1, wherein the first support layer comprises a first support portion corresponding to the first non-folding area, a second support portion corresponding to the second non-folding area, and a folding portion disposed between the first support portion and the second support portion and including a plurality of openings, and
    wherein the lower structure further comprises a cover layer attached to a bottom surface of the folding portion and spaced apart from the digitizer.

14. The display device of claim 1, wherein the lower structure includes a through hole penetrating through the first support layer, the digitizer, the electromagnetic shielding layer, the metal layer, and the second support layer.

15. A display device, comprising:
a display panel comprising a first non-folding area, a second non-folding area, and a folding area disposed between the first non-folding area and the second non-folding area;
a window disposed on the display panel; and
a lower structure disposed under the display panel,
wherein the lower structure further comprises:
- a digitizer comprising a loop coil, and overlapping the first non-folding area and the second non-folding area;
- an electromagnetic shielding layer disposed directly under the digitizer;
- a metal layer disposed under the electromagnetic shielding layer;
- a lower portion adhesion layer disposed directly under the metal layer; and
- a second support layer disposed directly under the lower portion adhesive layer, and comprising an insulating polymer material,
- wherein at least a portion of a bottom surface of the second support layer is a lowest surface of the lower structure.

16. The display device of claim 15, wherein the lower structure further comprises
- a lower portion protection film disposed under the display panel;
- a first additional adhesive layer disposed under the lower portion protection film;
- a first support layer disposed under the first additional adhesive layer; and
- a second additional adhesive layer disposed between the digitizer and the first support layer,
- wherein the first additional adhesive layer is disposed directly under the lower portion protection film,
- wherein the first support layer is disposed directly under the first additional adhesive layer,
- wherein the second additional adhesive layer is disposed directly under the first support layer, and
- wherein the digitizer is disposed directly under the second additional adhesive layer.

17. The display device of claim 15, wherein a thickness of the digitizer is about 120 μm to about 180 μm,
wherein a thickness of the electromagnetic shielding layer is about 30 μm to about 60 μm, and
wherein a thickness of the second support layer is about 1 μm to about 10 μm.

18. An electronic device, comprising:
a display device comprising a sensing area through which an optical signal is transmitted, and a display area adjacent to the sensing area; and
an electronic optical module disposed under the display device, overlapping the sensing area, and configured to receive the optical signal,
wherein the display device comprises:
a display panel comprising a first non-folding area, a second non-folding area, and a folding area disposed between the first non-folding area and the second non-folding area;
a window disposed on the display panel;
a first adhesive layer disposed between the window and the display panel, and having a first thickness; and
a lower structure disposed under the display panel,
wherein the lower structure further comprises:
- a first support layer overlapping the first non-folding area and the second-non-folding area;
- a digitizer disposed under the first support layer, comprising a loop coil, and overlapping the first non-folding area and the second non-folding area;
- an electromagnetic shielding layer disposed under the digitizer and having a second thickness;
- a metal layer disposed under the electromagnetic shielding layer; and
- a second support layer disposed under the metal layer and having insulation property,
- wherein the first thickness is about 75 μm to about 100 μm, and the second thickness is about 30 μm to about 60 μm, and
- wherein at least a portion of a bottom surface of the second support layer is a lowest surface of the lower structure.

19. The electronic device of claim 18, wherein the lower structure includes a through hole penetrating through the first support layer, the digitizer, the electromagnetic shielding layer, the metal layer, and the second support layer.

20. The electronic device of claim 19, wherein the through hole is aligned to the sensing area, and the electronic optical module overlaps the through hole.

21. The electronic device of claim 18, wherein the electronic optical module comprises a camera module.

22. The electronic device of claim 18, wherein the display panel comprises a first pixel disposed in the display area and a second pixel disposed in the sensing area.

23. The electronic device of claim 22, wherein a resolution of the display area is larger than that of the sensing area.

24. The electronic device of claim 22, wherein, within a reference area, an occupation ratio of a light shielding structure in the sensing area is smaller than that of the light shielding structure in the display area.

25. The electronic device of claim 18, wherein the sensing area comprises a non-transparent area including a light-emitting element and a transparent area that does not include a light-emitting element.

* * * * *